(12) United States Patent
Dupont et al.

(10) Patent No.: US 10,923,528 B2
(45) Date of Patent: Feb. 16, 2021

(54) OPTOELECTRONIC DEVICE COMPRISING PIXELS WITH IMPROVED CONTRAST AND BRIGHTNESS

(71) Applicant: Aledia, Grenoble (FR)

(72) Inventors: Tiphaine Dupont, Grenoble (FR); Sylvia Scaringella, Eybens (FR); Erwan Dornel, Fontaine (FR); Philippe Gibert, Saint-Etienne-de-Crossey (FR); Philippe Gilet, Teche (FR); Xavier Hugon, Teche (FR); Fabienne Goutaudier, Grenoble (FR)

(73) Assignee: Aledia, Echirolles (FR)

( * ) Notice: Subject to any disclaimer, the term of this patent is extended or adjusted under 35 U.S.C. 154(b) by 0 days.

(21) Appl. No.: 16/313,005

(22) PCT Filed: Jun. 22, 2017

(86) PCT No.: PCT/FR2017/051671
§ 371 (c)(1),
(2) Date: Dec. 21, 2018

(87) PCT Pub. No.: WO2018/002485
PCT Pub. Date: Jan. 4, 2018

(65) Prior Publication Data
US 2019/0165040 A1    May 30, 2019

(30) Foreign Application Priority Data

Jun. 30, 2016 (FR) .................................. FR1656170

(51) Int. Cl.
*H01L 27/15* (2006.01)
*H01L 33/00* (2010.01)
(Continued)

(52) U.S. Cl.
CPC .......... *H01L 27/156* (2013.01); *H01L 33/007* (2013.01); *H01L 33/0093* (2020.05);
(Continued)

(58) Field of Classification Search
CPC . H01L 27/156; H01L 33/0093; H01L 33/007; H01L 33/08; H01L 33/18;
(Continued)

(56) References Cited

U.S. PATENT DOCUMENTS

2006/0203468 A1* 9/2006 Beeson ................ G02B 27/286
362/84
2011/0126891 A1 6/2011 Goto et al.
(Continued)

FOREIGN PATENT DOCUMENTS

CN    101383341 A    3/2009
FR    1 359 413 A    4/1964
(Continued)

OTHER PUBLICATIONS

PCT/FR2017/051671, Oct. 16, 2017, International Search Report and Written Opinion.
(Continued)

*Primary Examiner* — Bo B Jang
(74) *Attorney, Agent, or Firm* — Wolf, Greenfield & Sacks, P.C.

(57) ABSTRACT

An optoelectronic device including a substrate including first and second opposite surfaces and lateral electrical insulation elements extending in the substrate and delimiting first electrically-insulated semiconductor or conductive portions. The optoelectronic device includes, for each first portion, an assembly of light-emitting diodes electrically coupled to the first portion. The optoelectronic device includes an electrode layer covering all the light-emitting diodes, a protection layer covering the electrode layer, and
(Continued)

walls extending in the protection layer and delimiting second portions surrounding or opposite the assemblies of light-emitting diodes. The walls contain at least one material from the group including air, a metal, a semiconductor material, a metal alloy, a partially transparent material, and a core made of an at least partially transparent material covered with an opaque or reflective layer.

20 Claims, 11 Drawing Sheets

(51) Int. Cl.
| | |
|---|---|
| *H01L 33/08* | (2010.01) |
| *H01L 33/18* | (2010.01) |
| *H01L 33/24* | (2010.01) |
| *H01L 33/38* | (2010.01) |
| *H01L 33/42* | (2010.01) |
| *H01L 33/54* | (2010.01) |
| *H01L 33/60* | (2010.01) |
| *H01L 33/62* | (2010.01) |
| *H01L 33/64* | (2010.01) |
| *H01L 33/50* | (2010.01) |

(52) U.S. Cl.
CPC ............. *H01L 33/08* (2013.01); *H01L 33/18* (2013.01); *H01L 33/24* (2013.01); *H01L 33/385* (2013.01); *H01L 33/42* (2013.01); *H01L 33/54* (2013.01); *H01L 33/60* (2013.01); *H01L 33/62* (2013.01); *H01L 33/641* (2013.01); *H01L 33/50* (2013.01); *H01L 33/642* (2013.01); *H01L 33/644* (2013.01)

(58) Field of Classification Search
CPC ....... H01L 33/24; H01L 33/385; H01L 33/42; H01L 33/54; H01L 33/60; H01L 33/62; H01L 33/641; H01L 33/50; H01L 33/642; H01L 33/644
See application file for complete search history.

(56) References Cited

U.S. PATENT DOCUMENTS

2016/0218240 A1\* 7/2016 Bouvier ................ H01L 33/005
2017/0133356 A1\* 5/2017 Mercier ................ H01L 27/153

FOREIGN PATENT DOCUMENTS

| FR | 3 011 383 A1 | 4/2015 |
| WO | WO 03/012884 A1 | 2/2003 |
| WO | WO 2016/001200 A1 | 1/2016 |
| WO | WO 2016/108021 A1 | 7/2016 |

OTHER PUBLICATIONS

PCT/FR2017/051671, Jan. 10, 2019, International Preliminary Report on Patentability.
International Search Report and Written Opinion for International Application No. PCT/FR2017/051671, dated Oct. 16, 2017.
International Preliminary Report on Patentability for International Application No. PCT/FR2017/051671, dated Jan. 10, 2019.

\* cited by examiner

OPTOELECTRONIC DEVICE COMPRISING PIXELS WITH IMPROVED CONTRAST AND BRIGHTNESS

This application is a national stage filing under 35 U.S.C. 371 of International Patent Application Serial No. PCT/FR2017/051671, filed Jun. 22, 2017, which claims priority to French patent application FR16/56170, filed Jun. 30, 2016. The entire contents of these applications are incorporated herein by reference in their entirety.

BACKGROUND

The present disclosure relates to an optoelectronic device comprising light-emitting diodes, particularly light-emitting diodes made of inorganic materials, for example, a display screen or an image projection device.

DISCUSSION OF THE RELATED ART

There exist optoelectronic devices, particularly display screens or projection devices, comprising light-emitting diodes based on semiconductor materials comprising a stack of semiconductor layers mostly comprising at least one group-III element and one group-V element, called III-V compound hereafter, particularly gallium nitride (GaN), gallium indium nitride (GaInN), and gallium aluminum nitride (GaAlN).

A pixel of an image corresponds to the unit element of the image displayed by a display screen or projected by a projection device. When the optoelectronic device is a monochrome image display screen or a monochrome image projection device, it generally comprises a single light source, or image pixel, for the display of each pixel of the image. When the optoelectronic device is a color image display screen or a color image projection device, it generally comprises, for the display of each image pixel, at least three emission and/or light intensity regulation components, also called display sub-pixels, which each emit a light radiation substantially in a single color (for example, red, green, and blue). The superposition of the radiations emitted by the three display sub-pixels provides the observer with the colored sensation corresponding to the pixel of the displayed image. In this case, the assembly formed by the three display sub-pixels used for the display of an image pixel is called display pixel of the display screen or of the projection device.

It is known to form optoelectronic devices comprising light-emitting diodes formed from three-dimensional semiconductor elements, for example, microwires, nanowires, conical elements, or frustoconical elements. The light-emitting diodes are then called three-dimensional.

Still unpublished patent application PCT/FR2015/053754 describes optoelectronic devices comprising three-dimensional light-emitting diodes, particularly display screens or projection devices, comprising display pixels. The use of three-dimensional light-emitting diodes enables to increase the maximum light intensity capable of being emitted by each display sub-pixel as compared with a light-emitting diode obtained by stacking of planar semiconductor layers.

Many constraints should be taken into account on design of an electronic device with display pixels, that is:

the luminance, defined as being the quotient of the light intensity of the luminous surface area of the optoelectronic device to the area of this surface projected onto the perpendicular to the observation direction, should be as high as possible;

the contrast, defined as the light intensity ratio between an extreme white point and an extreme black point, should be as high as possible; and the heat generated by the light-emitting diodes should be efficiently discharged.

It may be difficult to satisfy all these constraints when the display pixels comprise three-dimensional light-emitting diodes.

SUMMARY

An object of an embodiment is to overcome all or part of the disadvantages of the previously—described optoelectronic devices comprising three-dimensional light-emitting diodes, particularly display screens or projection devices.

Another object of an embodiment is to increase the luminance of the optoelectronic device.

Another object of an embodiment is to increase the contrast of the optoelectronic device.

Another object of an embodiment is to increase the discharge of the heat generated by the light sources of the optoelectronic device.

Thus, an embodiment provides an optoelectronic device comprising a substrate comprising first and second opposite surfaces, lateral electrical insulation elements extending from the first surface to the second surface and delimiting in the substrate first semiconductor or conductive portions electrically insulated from one another, the optoelectronic device further comprising, for each first portion, an assembly of light-emitting diodes resting on the first surface and electrically coupled to the first portion, the optoelectronic device further comprising an at least partially transparent conductive electrode layer covering all the light-emitting diodes, a protection layer containing a first dielectric material at least partially transparent at least in the emission wavelength range of the light-emitting diodes and possible luminophores present in the protection layer covering the electrode layer, and walls at least partly extending in the protection layer and delimiting in the protection layer second portions surrounding or opposite the assemblies of light-emitting diodes, the walls containing at least one second material different from the first material and comprised in the group comprising air, a metal, a semiconductor material, a metal alloy, a material partially transparent at least in the emission wavelength of the light-emitting diodes and of the possible luminophores, and a core made of a material at least partially transparent at least in the emission wavelength range of the light-emitting diodes and of the possible luminophores covered with a layer which is opaque or reflective at least in the emission wavelength range of the light-emitting diodes and of the possible luminophores.

According to an embodiment, each light-emitting diode comprises at least one wire-shaped, conical, or tapered semiconductor element integrating or covered at the top and/or at least over a portion of its lateral surfaces with a shell comprising at least one active layer capable of supplying most of the radiation of the light-emitting diode.

According to an embodiment, the protection layer surrounds each light-emitting diode.

According to an embodiment, the protection layer does not surround the light-emitting diodes.

According to an embodiment, the walls at least partly extend across the entire thickness of the protection layer.

According to an embodiment, at least one of the walls comprises a solid block continued by an opening filled with air.

According to an embodiment, the protection layer comprises luminophores.

According to an embodiment, the protection layer comprises a single crystal of a luminophore.

According to an embodiment, the optoelectronic device further comprises a plate of a material at least partly transparent at least in the emission wavelength range of the light-emitting diodes and of the possible luminophores, covering the protection layer and mechanically coupled to the substrate.

According to an embodiment, the plate is separated from the protection layer by an air or partial vacuum film.

According to an embodiment, the optoelectronic device further comprises additional walls having a height greater than the thickness of the protection layer in contact with the plate and resting on the substrate.

According to an embodiment, the optoelectronic device further comprises a conductive layer covering the electrode layer around the light-emitting diodes of each assembly.

According to an embodiment, the substrate is made of silicon, of germanium, of silicon carbide, of a III-V compound, such as GaN or GaAs, or of ZnO.

According to an embodiment, each semiconductor element is mostly made of a III-V compound, particularly gallium nitride, or of a II-VI compound.

According to an embodiment, the optoelectronic device is a display screen or a projection device.

According to an embodiment, the optoelectronic device further comprises, on the encapsulation layer, filters capable of at least partly absorbing and/or of reflecting the radiation emitted by the light-emitting diodes.

According to an embodiment, the optoelectronic device further comprises, on the plate, filters capable of at least partly absorbing and/or of reflecting the radiation emitted by the light-emitting diodes.

According to an embodiment, the walls correspond to portions of the substrate.

An embodiment also provides a method of manufacturing an optoelectronic device, comprising the steps of:

a) forming, in a substrate comprising first and second opposite surfaces, lateral electrical insulation elements extending from the first surface to the second surface and delimiting in the substrate first semiconductor or conductive portions electrically insulated from one another;

b) forming, for each first portion, an assembly of light-emitting diodes resting on the first surface and electrically coupled to the first portion;

c) forming, for each first portion, a conductive and at least partially transparent electrode layer covering all the light-emitting diodes;

d) forming a protection layer of a first dielectric material at least partially transparent at least in the emission wavelength range of the light-emitting diodes and of possible luminophores present in the protection layer covering the electrode layer and walls at least partly extending in the protection layer and delimiting in the protection layer second portions surrounding or opposite the assemblies of light-emitting diodes, the walls containing at least one second material different from the first material and comprised in the group comprising air, a metal, a metal alloy, a material partially transparent at least in the emission wavelength range of the light-emitting diodes and of the possible luminophores, and a core made of a material at least partially transparent at least in the emission wavelength range of the light-emitting diodes and of the possible luminophores covered with a layer which is opaque or reflective at least in the emission wavelength range of the light-emitting diodes and of the possible luminophores.

According to an embodiment, each light-emitting diode comprises at least one wire-shaped, conical, or tapered semiconductor element integrating or covered at the top and/or at least over a portion of its lateral surfaces with a shell comprising at least one active layer capable of supplying most of the radiation of the light-emitting diode.

According to an embodiment, the protection layer surrounds each light-emitting diode.

According to an embodiment, the protection layer does not surround the light-emitting diodes.

According to an embodiment, the walls at least partly extend across the entire thickness of the protection layer.

According to an embodiment, at least one of the walls comprises a solid block continued by an opening filled with air.

According to an embodiment, the protection layer comprises luminophores.

According to an embodiment, the protection layer comprises a single crystal of a luminophore.

According to an embodiment, the method further comprises the mechanical coupling to the substrate of a plate of a material at least partly transparent at least in the emission wavelength range of the light-emitting diodes and of the possible luminophores and covering the protection layer.

According to an embodiment, the plate is separated from the protection layer by an air or partial vacuum film.

According to an embodiment, the method further comprises the forming of additional walls having a height greater than the thickness of the protection layer in contact with the plate and resting on the substrate.

According to an embodiment, the method further comprises the forming of a conductive layer covering the electrode layer around the light-emitting diodes of each assembly.

According to an embodiment, the substrate is made of silicon, of germanium, of silicon carbide, of a III-V compound, such as GaN or GaAs, or of ZnO.

According to an embodiment, each semiconductor element is mostly made of a III-V compound, particularly gallium nitride, or of a II-VI compound.

According to an embodiment, the optoelectronic device is a display screen or a projection device.

According to an embodiment, the method further comprises, the forming on the encapsulation layer of filters capable of at least partly absorbing and/or of reflecting the radiation emitted by the light-emitting diodes.

According to an embodiment, the method further comprises, the forming on the plate of filters capable of at least partly absorbing and/or of reflecting the radiation emitted by the light-emitting diodes.

According to an embodiment, the walls correspond to portions of the substrate.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1A:
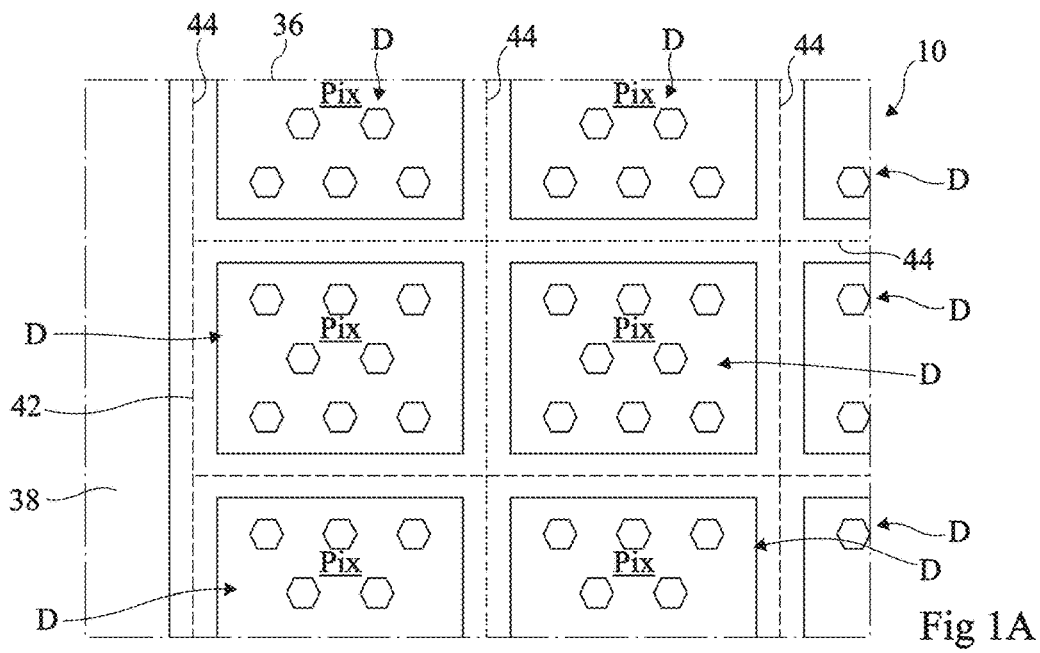
FIGS. 1A, 1B, and 1C are respectively a top view, a front cross-section view, and a bottom view, partial and simplified, of an embodiment of an optoelectronic device comprising light-emitting diodes.

For clarity, the same elements have been designated with the same reference numerals in the various drawings and, further, the various drawings are not to scale. Further, only those elements which are useful to the understanding of the described embodiments have been shown and are described. In particular, the device for controlling an optoelectronic device comprising light-emitting diodes is known by those skilled in the art and is not described hereafter. In the following description, the terms "substantially", "approximately", and "in the order of" are used herein to designate a tolerance of plus or minus 10% of the value in question.

The embodiments described hereafter relate to optoelectronic devices, particularly display screens or projection devices, comprising light-emitting diodes formed from three-dimensional semiconductor elements, for example, microwires, nanowires, conical elements, or tapered elements. In the following description, embodiments are described for light-emitting diodes formed from microwires or nanowires. However, such embodiments may be implemented for three-dimensional elements other than microwires or nanowires, for example, pyramid-shaped three-dimensional elements.

Further, in the following description, embodiments are described for light-emitting diodes each comprising a shell which at least partially surrounds the microwire or the nanowire. However, these embodiments may be implemented for light-emitting diodes for which the active area is located along the height or at the top of the microwire or of the nanowire.

The term "microwire" or "nanowire" designates a three-dimensional structure having a shape elongated in a preferred direction, having at least two dimensions, called minor dimensions, in the range from 5 nm to 5 µm, preferably from 50 nm to 2.5 µm, the third dimension, called major dimension, being at least equal to 1 time, preferably at least 5 times, and more preferably still at least 10 times, the largest of the minor dimensions. In certain embodiments, the minor dimensions may be smaller than or equal to approximately 1 µm, preferably in the range from 100 nm to 1 µm, more preferably from 100 nm to 300 nm. In certain embodiments, the height of each microwire or nanowire may be greater than or equal to 500 nm, preferably in the range from 1 µm to 50 µm.

In the following description, the term "wire" is used to mean "microwire" or "nanowire". Preferably, the median line of the wire which runs through the centers of gravity of the cross-sections, in planes perpendicular to the preferred direction of the wire, is substantially rectilinear and is called "axis" of the wire hereafter.

According to an embodiment, an optoelectronic device is provided, particularly a display screen or a projection device, which comprises an integrated circuit comprising a substrate, for example, a conductive or semiconductor substrate, divided into substrate portions electrically insulated from one another and comprising, for each display sub-pixel, assemblies of light-emitting diodes formed on the front surface of the substrate. Each assembly of light-emitting diodes comprises a light-emitting diode or a plurality of light-emitting diodes assembled in parallel. Parallel connection of light-emitting diodes means that the anodes of the light-emitting diodes are connected to one another and that the cathodes of the light-emitting diodes are connected to one another. Each assembly of elementary light-emitting diodes is equivalent to a general light-emitting diode comprising an anode and a cathode. The optoelectronic device further comprises means for increasing the luminance and/or the contrast.

Figure 1B:
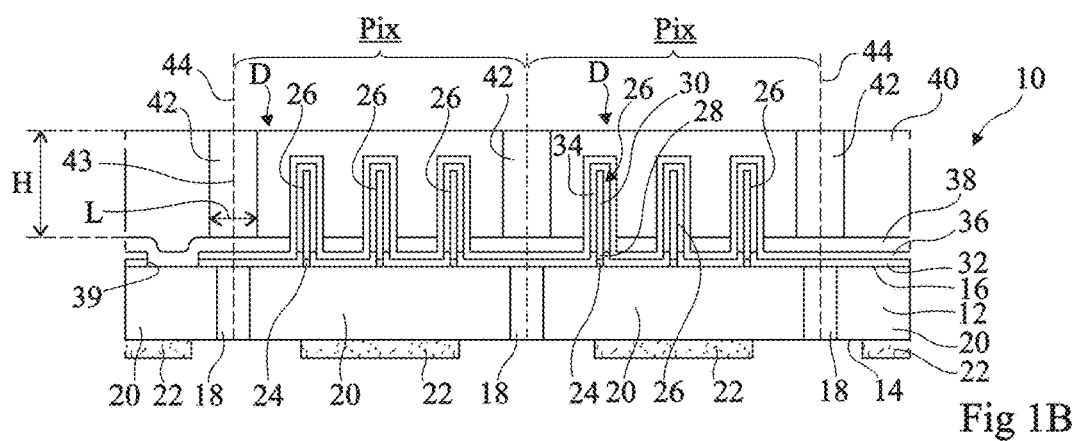
Figure 1C:
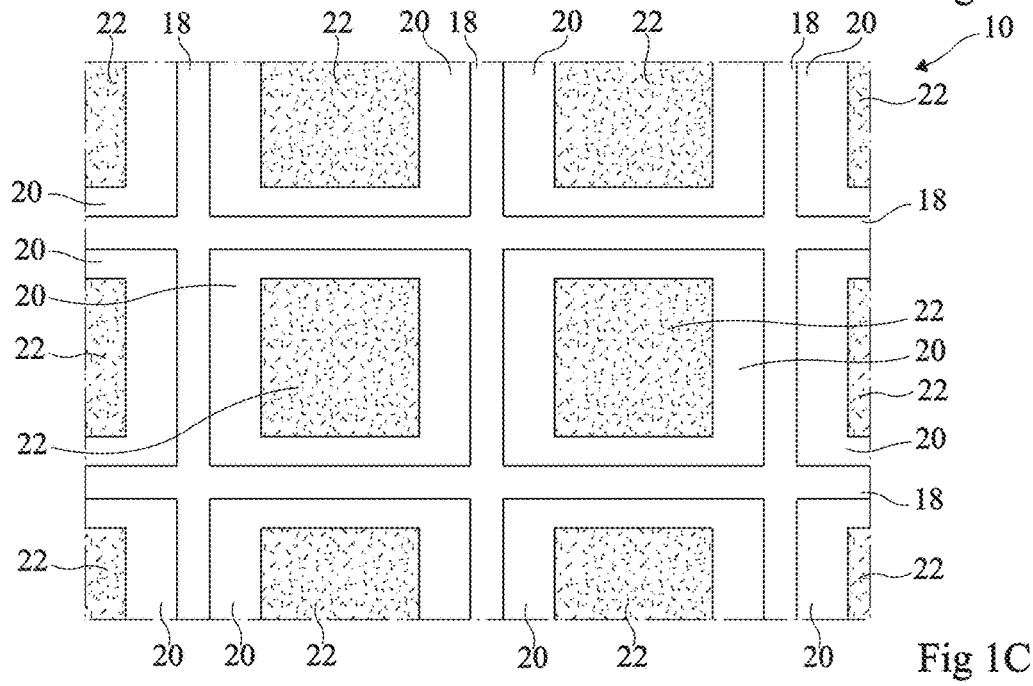

FIGS. 1A to 1C show an embodiment of an optoelectronic device 10, particularly a display screen and a projection device, comprising:

a conductive or semiconductor substrate 12 comprising a lower surface 14 and an opposite upper surface 16, upper surface 16 being preferably planar at least at the level of the assemblies of light-emitting diodes;

electrical insulation elements 18 which extend in substrate 12 between surfaces 14 and 16 and which divide substrate 12 into conductive or semiconductor portions 20;

electrically conductive pads 22 in contact with lower surface 14, each portion 20 being in contact with one of conductive pads 22;

seed pads 24 favoring the growth of wires, each seed pad 24 being in contact with surface 16 on one of conductive or semiconductor portions 20, where pads 24 may be replaced with a seed layer covering the active surface of each pixel;

wires 26, each wire 26 being in contact with one of seed pads 24, each wire 26 comprising a lower portion 28, in contact with seed pad 24 and an upper portion 30, continuing lower portion 28;

an insulating layer 32 extending on surface 16 of substrate 12 and extending on the lateral sides of lower portion 28 of each wire 26;

a shell 34 comprising a stack of semiconductor layers covering upper portion 30 of each wire 26;

an electrically-conductive layer 36 at least partially transparent in the emission wavelength range of the elementary light-emitting diodes forming an electrode covering each shell 34, and extending over insulating layer 32 between wires 26;

an electrically-conductive layer 38 covering electrode layer 36 between wires 26 but which does not extend over wires 26 or only over a portion of the lateral sides of wires 26, conductive layer 38 being further in contact with one of semiconductor portions 20 through an opening 39 provided in electrode layer 36 and in insulating layer 32 or, as a variation, conductive layer 38 being further electrically coupled to one of semiconductor portions 20, via electrode layer 36 through opening 39 then only provided in insulating layer 32;

an encapsulation layer 40, also called protection layer, at least partially transparent in the emission wavelength of the elementary light-emitting diodes and covering the entire structure and fully covering, in particular, each wire 26, encapsulation layer 40 being, as a variation, not present; and walls 42 extending in encapsulation layer 40 and surrounding each assembly D of wires 26 resting on each portion 20, the walls being made of a different material than encapsulation layer 40.

According to an embodiment, an insulating layer, also called passivation layer, may further be interposed between encapsulation layer 40 and conductive layer 38, between encapsulation layer 40 and the portions of electrode layer 36 which are not covered with conductive layer 38 and between walls 42 and conductive layer 38.

Each wire 26 and the associated shell 34 form an elementary light-emitting diode. The elementary light-emitting diodes located on a same semiconductor portion 20 form an assembly D of light-emitting diodes. Each assembly D thus comprises a plurality of elementary light-emitting diodes connected in parallel. The number of elementary light-emitting diodes per assembly D may vary from 1 to several tens of thousands, typically from 25 to 1,000. The number of elementary light-emitting diodes per assembly D may vary from one assembly to the other. Electrode layer 36 and encapsulation layer 40 are at least partially transparent in the emission wavelength range of the elementary light-emitting diodes.

Each display sub-pixel Pix of optoelectronic device 10 comprises one of conductive or semiconductor portions 20 and assembly D of light-emitting diodes resting on portion 20. In FIGS. 1A and 1B, the separation between display sub-pixels Pix has been schematically shown in dotted lines 44. According to an embodiment, the surface area occupied by each sub-pixel Pix in top view may vary from 3 µm by 3 µm to approximately 100,000 µm$^2$ and typically from 25 µm$^2$ to 6,400 µm$^2$.

Each elementary light-emitting diode is formed of a shell at least partially covering a wire. The developed surface area of the elementary light-emitting diodes of an assembly D is greater than the surface area of the display sub-pixel comprising assembly D. The maximum light intensity capable of being supplied by the display sub-pixel may thus be greater than that of a display sub-pixel formed with a two-dimensional inorganic light-emitting diode technology.

According to an embodiment, substrate 12 corresponds to a monolithic semiconductor substrate. Semiconductor substrate 12 is, for example, a substrate made of silicon, of germanium, or of a III-V compound such as GaAs. Preferably, substrate 12 is a single-crystal silicon substrate.

Preferably, semiconductor substrate 12 is doped to lower the electric resistivity down to a resistivity close to that of metals, preferably smaller than a few mohms·cm. Substrate 12 is, preferably, a heavily-doped semiconductor substrate with a dopant concentration in the range from $5*10^{16}$ atoms/cm$^3$ to $2*10^{20}$ atoms/cm$^3$, preferably from $1*10^{19}$ atoms/cm$^3$ to $2*10^{20}$ atoms/cm$^3$, for example, $5*10^{19}$ atoms/cm$^3$. At the beginning of the optoelectronic device manufacturing method, substrate 12 has a thickness in the range from 275 µm to 1,500 µm, preferably 725 µm. Once the optoelectronic device has been formed, after a thinning step described in further detail hereafter, substrate 12 has a thickness in the range from 0 µm to 100 µm. In the case of a silicon substrate 12, examples of P-type dopants are boron (B) or indium (In) and examples of N-type dopants are phosphorus (P), arsenic (As), or antimony (Sb). Preferably, substrate 12 is N-type phosphorus doped. Surface 14 of silicon substrate 12 may be a (100) or (111) surface.

Seed pads 24, also called seed islands, are made of a material favoring the growth of wires 26. A treatment may be provided to protect the lateral sides of the seed pads and the surface of the substrate portions which are not covered with the seed pads to prevent the growth of wires on the lateral sides of the seed pads and on the surface of the substrate portions which are not covered with the seed pads. The treatment may comprise the forming of a dielectric region on the lateral sides of the seed pads and extending on top of and/or inside of the substrate and coupling, for each pair of pads, one of the pads in the pair to the other pad in the pair, without for the wires to grow on the dielectric region. Said dielectric region may continue above seed pads 24. As a variation, seed pads 24 may be replaced, for each sub-pixel, with a seed layer covering surface 16 of substrate 12, thus delimiting the active surface of each pixel and corresponding to a surface area smaller than that of the pixel, where each seed layer does not extend above insulation trenches 18. A dielectric layer can then be formed above the seed layer to prevent the growth of wires in unwanted locations.

As an example, the material forming seed pads 24 may be a transition metal from column IV, V, VI of the periodic table of elements or a nitride, a carbide, or a boride of a transition metal from column IV, V, or VI of the periodic table of elements or a combination of these compounds.

As an example, seed pads 24 may be made of aluminum nitride (AlN), of boron (B), of boron nitride (BN), of titanium (Ti), or titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB$_2$), of zirconium nitride (ZrN), of silicon carbide (SiC), of tantalum nitride and carbide (TaCN), of magnesium nitride in Mg$_x$N$_y$ form, where x is approximately equal to 3 and y is approximately equal to 2, for example, magnesium nitride in Mg$_3$N$_2$ form or magnesium gallium nitride (MgGaN), of tungsten (W), of tungsten nitride (WN), or of a combination thereof.

As a variation, the germanium pads may be replaced with a seed structure comprising seed pads covered with a second seed layer or comprising a first seed layer covered with the second seed layer. As an example, the second seed layer may be a transition metal from column IV, V, VI of the periodic table of elements or a nitride, a carbide, or a boride of a transition metal from column IV, V, or VI of the periodic table of elements or a combination of these compounds. The second seed layer may be formed from the first seed layer. For example, a second nitride seed layer may be formed by epitaxy from an aluminum nitride layer formed by epitaxy. A method of manufacturing such a seed structure is described in French patent application FR1656008 filed on 28 Jun. 2016, which is incorporated herein by reference.

Insulating layer 32 may be made of a dielectric material, for example, of silicon oxide (SiO$_2$), of silicon nitride (Si$_x$N$_y$, where x is approximately equal to 3 and y is approximately equal to 4, for example, Si$_3$N$_4$), of silicon oxynitride (SiO$_x$N$_y$, where x may be approximately equal to ½ and y may be approximately equal to 1, for example, Si$_2$ON$_2$), of aluminum oxide (Al$_2$O$_3$), of hafnium oxide (HfO$_2$), or of diamond. As an example, the thickness of insulating layer 32 is in the range from 5 nm to 1 µm, for example, equal to approximately 30 nm.

Wires 26 are at least partly made of at least one semiconductor material. The semiconductor material may be silicon, germanium, silicon carbide, a III-V compound, a II-VI compound, or a combination of these compounds.

Wires 26 may be at least partly made of semiconductor materials mostly comprising a III-V compound, for example, III-N compounds. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions.

Wires 26 may be at least partly formed from semiconductor materials mostly comprising a II-VI compound. Examples of group-II elements comprise group-IIA elements, particularly beryllium (Be) and magnesium (Mg), and group-IIB elements, particularly zinc (Zn) and cadmium (Cd). Examples of group-VI elements comprise group-VIA elements, particularly oxygen (O) and tellurium (Te). Examples of II-VI compounds are ZnO, ZnMgO, CdZnO, or CdZnMgO. Generally, the elements in the II-VI compound may be combined with different molar fractions.

Wires 26 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn).

The cross-section of wires 26 may have different shapes, such as, for example, an oval, circular, or polygonal shape, particularly triangular, rectangular, square, or hexagonal. As an example, in FIG. 3A, the wires are shown with a hexagonal cross-section. It should thus be understood that term "diameter" or "average diameter" in a cross-section of a wire or of a layer deposited on this wire designates a quantity associated with the surface area of the targeted structure in this cross-section, for example corresponding to the diameter of the disk having the same surface area as the cross-section of the wire. The average diameter of each wire 26 may be in the range from 50 nm to 5 µm. The height of each wire 26 may be in the range from 250 nm to 50 µm. Each wire 26 may have a semiconductor structure elongated along an axis substantially perpendicular to surface 16. Each wire 26 may have a generally cylindrical shape. The axes of two adjacent wires 26 may be distant by from 0.5 µm to 10 µm and preferably from 1.5 µm to 5 µm. As an example, wires 26 may be regularly distributed, particularly in a hexagonal network.

As an example, the lower portion 28 of each wire 26 may be mostly made of the III-N compound, for example, gallium nitride, doped with the same conductivity type as substrate 12, for example, type N, for example, with silicon, or doped of the type opposite to that of substrate 12. Lower portion 28 extends along a height which may be in the range from 100 nm to 25 µm.

As an example, upper portion 30 of each wire 26 is at least partially made of a III-N compound, for example, GaN. Upper portion 30 may be N-type doped, possibly less heavily doped than lower portion 28, or may not be intentionally doped. Upper portion 30 extends along a height which may be in the range from 100 nm to 25 µm.

Shell 34 may comprise a stack of a plurality of layers especially comprising:
  an active layer covering upper portion 30 of the associated wire 26;
  an intermediate layer having a conductivity type opposite to that of lower portion 28 and covering the active layer; and
  a bonding layer covering the intermediate layer and covered with electrode 36.

The active layer is the layer from which most of the radiation supplied by the elementary light-emitting diode is emitted. According to an example, the active layer may comprise means for confining the electric charge carriers, such as multiple quantum wells. It is for example formed of an alternation of GaN and InGaN layers having respective thicknesses from 5 to 20 nm (for example, 8 nm) and from 1 to 15 nm (for example, 2.5 nm). The GaN layers may be doped, for example, of type N or P. According to another example, the active layer may comprise a single InGaN layer, for example having a thickness greater than 10 nm.

The intermediate layer, for example, P-type doped, may correspond to a semiconductor layer or to a stack of semiconductor layers and enables to form a P-N or P-I-N junction, the active layer being located between the intermediate P-type layer and upper N-type portion 30 of the P-N or P-I-N junction.

The bonding layer may correspond to a semiconductor layer or to a stack of semiconductor layers and enables to form an ohmic contact between the intermediate layer and electrode 36. As an example, the bonding layer may be very heavily doped with a doping type opposite to that of lower portion 28 of each wire 26, until degeneration of the semiconductor layer(s), for example, P-type doped with a concentration greater than or equal to $10^{20}$ atoms/cm$^3$.

The stack of semiconductor layers may comprise an electron barrier layer formed of a ternary alloy, for example, of aluminum gallium nitride (AlGaN) or of aluminum indium nitride (AlInN) in contact with the active layer and the intermediate layer, to ensure a good distribution of electric carriers in the active layer.

Electrode 36 is capable of biasing the active layer of each wire 26 and of giving way to the electromagnetic radiation emitted by the light-emitting diodes. The material forming electrode 36 may be a material at least partially transparent in the emission wavelength of the elementary light-emitting diodes and electrically conductive, such as indium tin oxide (or ITO), aluminum zinc oxide, gallium zinc oxide and/or indium zinc oxide, or graphene. As an example, electrode layer 36 has a thickness in the range from 5 nm to 200 nm, preferably from 20 nm to 100 nm.

Conductive layer 38 preferably corresponds to a metal layer, for example, made of aluminum, of copper, of gold, of ruthenium, or of silver, or to a stack of metal layers, for example, made of titanium-aluminum, of silicon-aluminum, of titanium-nickel-silver, of copper, or of zinc. As an example, conductive layer 38 has a thickness in the range from 20 nm to 3,000 nm, preferably from 400 nm to 800 nm. Conductive layer 38 is only present between the wires and does not cover the emissive surface thereof. Conductive layer 38 enables to decrease resistive losses during the current flow. It also has a reflector function to reflect towards the outside rays emitted by the light-emitting diodes towards the substrate.

Encapsulation layer 40 is made of an insulating material at least partially transparent in the emission wavelength of the elementary light-emitting diodes. The minimum thickness of encapsulation layer 40 is in the range from 250 nm to 50 µm so that encapsulation layer 40 preferably totally covers electrode 36 at the top of light-emitting diodes assemblies D. Layer 40 may totally fill the space between wires. As a variation, layer 40 may take the shape of the wires. Encapsulation layer 40 may be made of an at least partially transparent inorganic material. As an example, the inorganic material is selected from the group comprising silicon oxides of SiO$_x$ type, where x is a real number between 1 and 2 or SiO$_y$N$_z$, where y and z are real numbers between 0 and 1, and aluminum oxides, for example, Al$_2$O$_3$. Encapsulation layer 40 may be made of an at least partially transparent organic material. As an example, encapsulation layer 40 is a silicone polymer, an epoxide polymer, an acrylic polymer, or a polycarbonate.

Electrical insulation elements 18 may comprise trenches extending across the entire thickness of substrate 12 and filled with an insulating material, for example, an oxide, particularly silicon oxide, or an insulating polymer. As a variation, the walls of each trench 18 are covered with an insulating layer, the rest of the trench being filled with a semiconductor or conductive material, for example, polysilicon. According to another variation, electrical insulation elements 18 comprise doped regions of a polarity type opposite to that of substrate 12 and extending across the entire depth of substrate 12. As an example, each trench 18 has a width greater than 1 µm, which particularly varies from 1 µm to 10 µm, for example, approximately 2 µm. In FIGS. 3B and 3C, electrical insulation elements 18 comprise, for each portion 20 of substrate 12, a single trench which delimits portion 20 of substrate 12. As an example, pairs of adjacent trenches may be provided to electrically insulate each portion 20, the distance between the two trenches 18 of a pair of adjacent trenches 18 being for example greater than 5 µm, for example, approximately 6 µm.

Generally, trenches as thin as this can only be formed with a limited depth, between some ten micrometers and some hundred micrometers according to the selected etching and insulation technique. Substrate 12 should thus be thinned until electrical insulation elements 18 are exposed.

To achieve this, a handle made of a rigid material may be temporarily or definitively bonded to encapsulation layer 40. In the case where the handle is definitively bonded to encapsulation layer 40, the handle is made of a material at least partially transparent in the emission wavelength range of the elementary light-emitting diodes. It may be glass, particularly a borosilicate glass, for example, the glass known as Pyrex, or sapphire. After thinning, rear surface 14 of the substrate may be treated, and then, if the bonding is temporary, the handle may be detached.

Each conductive pad 22 may correspond to a layer or to a stack of layers covering surface 14. As a variation, an insulating layer may partially cover surface 14, each conductive pad 22 being in contact with the associated semiconductor portion 20 through openings etched in this insulating layer.

As shown in FIG. 1B, each wall 42 extends from conductive layer 38 across the entire thickness H of encapsulation layer 40. As a variation, the height of each wall 42 may be smaller or greater than thickness H of encapsulation layer 40. In the present embodiment, the height of each wall 42 may be greater than or equal to the height of wires 26. Preferably, the width of each wall 42 is smaller than or equal to the smallest distance between two elementary light-emitting diodes of adjacent assemblies D. Width L of each wall 42 may be in the range from 0.5 µm to 12 µm.

The presence of walls 42 advantageously enables to increase the contrast of optoelectronic device 10. Further, they enable to increase the luminance of optoelectronic device 10, particularly along an observation direction perpendicular to upper surface 16 of substrate 12.

According to an embodiment, each wall 42 is formed of a block of a solid material or of a plurality of solid materials 43.

According to an embodiment, each wall 42 comprises reflective walls. According to an embodiment, walls 42 are made of a material which is a good heat conductor, for example, of a metal or a metal alloy, for example, of Cu, Ag, CuAg, CuSnAg, CuNi, CuNiAu, Al, ZnAl, or AlCu. Walls 42 then further ease the discharge towards substrate 12 of the heat generated during the operation of the light-emitting diodes. As a variation, each wall 42 may comprise a core, for example, a metal core, covered with a reflective layer.

According to an embodiment, each wall 42 comprises opaque walls. As an example, each wall 42 may comprise a core covered with a black-colored resin layer. This resin is preferably capable of absorbing an electromagnetic radiation over the spectral range including the emission spectrum of the elementary light-emitting diodes and that of the luminophores, when they are present. According to another embodiment, each wall 42 is made of a resin partially transparent to visible light.

According to an embodiment, walls 42 are not totally made of black-colored resin.

According to an embodiment, each wall 42 comprises a reflective wall, for example, polymer with TiO$_2$ particles.

FIG. 1B shows walls 42 with substantially parallel lateral walls substantially perpendicular to upper surface 16 of substrate 12. As a variation, the lateral walls 42 may be inclined with respect to upper surface 16 of substrate 12 to come closer to each other as their distance from substrate 12 increases. This enables to increase the luminance of optoelectronic device 10, particularly along an observation direction perpendicular to upper surface 16 of substrate 12.

Optoelectronic device 10 may further comprise photoluminescent materials, also called luminophores in encapsulation layer 40 or on encapsulation layer 40. The luminophores are capable, when they are excited by the light emitted by the light-emitting diodes, of emitting light at a wavelength different from the wavelength of the light emitted by the light-emitting diodes. According to an embodiment, luminophores are in particular distributed between wires 26. Preferably, when the luminophores are embedded within encapsulation layer 40, the average diameter of the luminophores is selected so that at least part of the luminophores are distributed between wires 26. Preferably, the luminophore diameter is in the range from 1 nm to 1,000 nm.

The photoluminescent material may be an aluminate, a silicate, a nitride, a fluoride, or a sulfide emitting light at a wavelength in the range from 400 to 700 nm under a light excitation having a wavelength in the range from 300 to 500 nm, or preferably from 380 to 480 nm.

Preferably, the photoluminescent material is an aluminate, particularly an yttrium aluminum garnet according to the following formula (1):

$$(Y_{3-x}R^1_x)(Al_{5-y}R^2_y)O_{12} \qquad (1)$$

where $R^1$ and $R^2$ are independently selected from the elements comprising rare earths, alkaline earths, and transition metals and x and y each independently vary from 0 to 1.5, preferably from 0 to 1. Preferably, $R^1$ and $R^2$ are independently selected from the group comprising cerium, samarium, gadolinium, silicon, barium, terbium, strontium, chromium, praseodymium, and gallium.

As an example of nitrides absorbing and emitting light in the desired wavelength ranges, the following can be mentioned: CaAlSiN$_3$:Eu, (Ca,Sr)AlSiN$_3$:Eu, Ca$_2$Si$_5$N$_8$:Eu, or (Ca,Sr)Si$_5$N$_8$:Eu.

As an example of fluorides absorbing and emitting light in the desired wavelengths, fluorides of formula K$_2$MF$_6$:Mn (where M may be Si, Ge, Sn, or Ti) can be mentioned.

As an example of sulfides absorbing and emitting light in the desired wavelength ranges, the following can be mentioned: CaS:Eu, SrCa:Eu, (Sr,Ca)S:Eu, and SrGa$_2$S$_4$:Eu.

As an example of aluminate absorbing and emitting light in the desired wavelength ranges, the following can be mentioned: Y$_3$Al$_5$O$_{12}$:Ce, (Y,Gd)$_3$Al$_5$O$_{12}$:Ce, Tb$_3$Al$_5$O$_{12}$, (Y,Tb)$_3$Al$_5$O$_{12}$, Lu$_3$Al$_5$O$_{12}$:Ce, and Y$_3$(Al,Ga)$_5$O$_{12}$.

As an example of silicates absorbing and emitting light in the desired wavelength ranges, the following can be mentioned: (Sr,Ba)$_2$SiO$_4$:Eu, Sr$_2$SiO$_4$:Eu, Ba$_2$SiO$_4$:Eu, Ca$_2$SiO$_4$:Eu, Ca$_3$SiO$_5$:Eu, and Sr$_3$SiO$_5$:Eu.

According to an embodiment, the luminophores may comprise semiconductor materials capable of providing a quantum confinement in at least one direction of space, such as quantum dots or quantum wells.

When encapsulation layer 40 comprises luminophores, different luminophores may be provided according to the assemblies D of light-emitting diodes.

Figure 6:
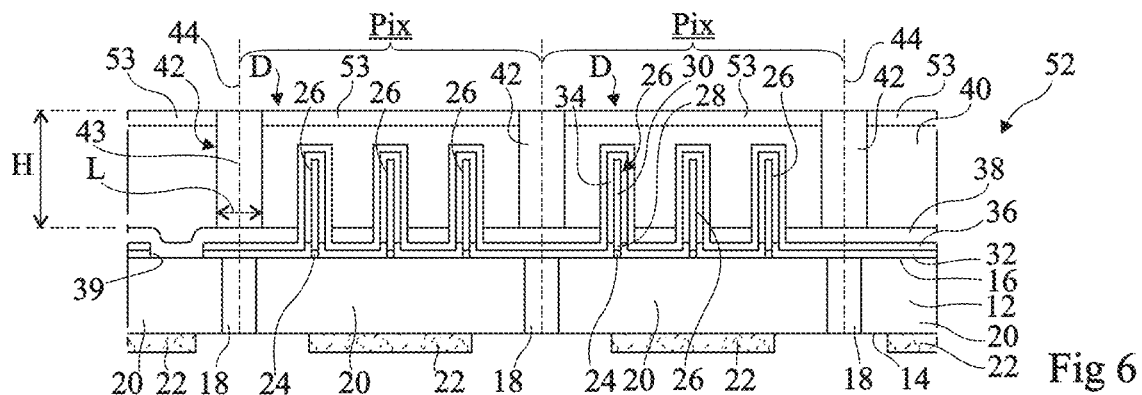
FIGS. 6 to 25 are views similar to FIG. 1B of other embodiments of an optoelectronic device comprising light-emitting diodes.

FIG. 6 shows another embodiment of an optoelectronic device 52 comprising all the elements of optoelectronic device 10 and further comprising, for each display sub-pixel Pix, an optical filter 53 on encapsulation layer 40. Preferably, filter 53 is only absent from walls 42. Each optical filter 53 may comprise one layer, two layers, or more than two layers capable of absorbing and/or reflecting the radiation emitted by the elementary light-emitting diodes. According to an embodiment, optical filters 53 are transparent in the emission spectral range of the luminophores associated with the display sub-pixel when they are present. Each optical filter 53 may comprise at least one colored polymer, photosensitive or not, or comprise a stack of dielectric layers forming a dichroic filter.

Lenses may be provided on encapsulation layer 40. As an example, one lens may be provided for each sub-pixel or for sub-pixel assemblies.

According to an embodiment, optoelectronic device 10 is at least partly formed according to the method described in patent application FR13/59413 which is herein incorporated by reference.

An embodiment of a method of manufacturing optoelectronic device 10 may comprise the steps of:

(1) Etching, for each electrical insulation element 18, an opening in substrate 12 on the side of front surface 16. The opening may be formed by an etching of reactive ion etching type, for example, a DRIE etching. The depth of the opening is greater than the targeted thickness of substrate 12 after a thinning step described hereafter. As an example, the depth of the opening is in the range from 10 μm to 200 μm, for example approximately 35 μm or 60 μm.

(2) Forming an insulating layer, for example, made of silicon oxide, on the lateral walls of the opening, for example, by a thermal oxidation method. The thickness of the insulating layer may be in the range from 100 nm to 3,000 nm, for example, approximately 200 nm.

(3) Filling the opening with a filling material, for example, polysilicon, tungsten, or a refractory metallic material compatible with the steps of the manufacturing method carried out at high temperatures, for example deposited by low pressure chemical vapor deposition (LPCVD). Polysilicon advantageously has a thermal expansion coefficient close to that of silicon and thus enables to decrease the mechanical stress during the steps of the manufacturing method carried out at high temperatures.

(4) Chem.-mech. polishing (CMP) to expose the silicon surface and remove any raised area.

(5) Forming seed portions 24, wires 26, insulating layer 32, and shells 34, by epitaxial growth, as described in patent applications WO2014/044960 and FR13/59413, which are incorporated herein by reference.

(6) Forming electrode 36 over the entire structure, for example by conformal chemical vapor deposition (CVD), particularly atomic layer deposition (ALD), or physical vapor deposition (PVD), by cathode sputtering, the deposition being likely to be followed by a step of annealing the electrode.

(7) Forming opening 39 through insulating layer 32 and electrode layer 36. When opening 39 is only present through insulating layer 32, it is formed before the step of forming electrode 36.

(8) Forming conductive layer 38 for example by PVD over the entire structure obtained at step (7) and etching this layer to expose the portion of electrode layer 36 covering each wire 26.

(9) Thermally annealing the contacts following the stacking of layer 38.

(10) Forming walls 42.

(11) Depositing encapsulation layer 40 over the entire structure obtained at step (10), for example, by a spin-on deposition method, by a jet printing method, by a silk-screening method, or by a sheet deposition method. When different luminophores can be provided according to the assemblies D of light-emitting diodes, a method of selective luminophore deposition comprises mixing the luminophore grains of a first color with silicon resist, and then, after spreading over the entire substrate and the light emitting diodes, bonding the luminophores to the desired sub-pixels by photolithography. The operation is repeated with a second luminophore and as many times as there are sub-pixels of different colors. Another method is to use inkjet-type printing equipment with an "ink" made of the silicone luminophore mixture and of specific additives. By printing, based on a mapping and on the orientation and of a referencing of the sub-pixels, the luminophores are deposited at the required locations.

(12) Gluing a temporary or permanent handle and thinning substrate 12 to reach lateral insulation elements 18.

(13) Forming conductive pads 22.

Figure 2A:
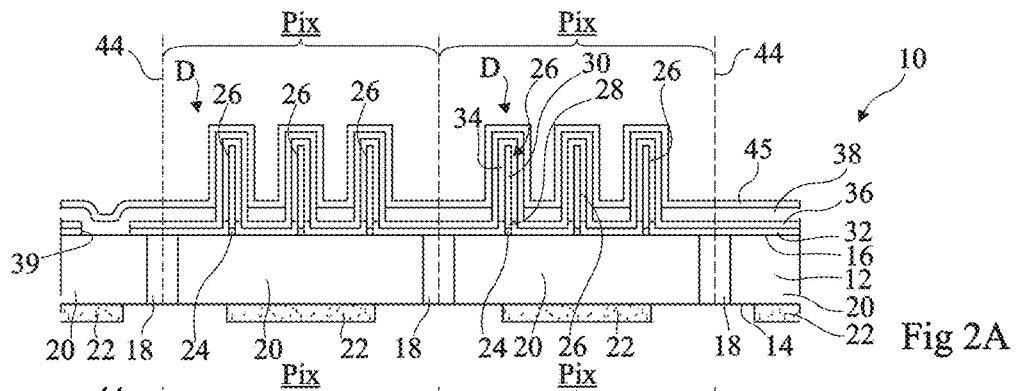
FIGS. 2A to 2C, 3A and 3B, 4A to 4E, and 5A to 5D illustrate the structures obtained at successive steps of embodiments of a method of manufacturing the optoelectronic device shown in FIGS. 1A to 1C.
Figure 2B:
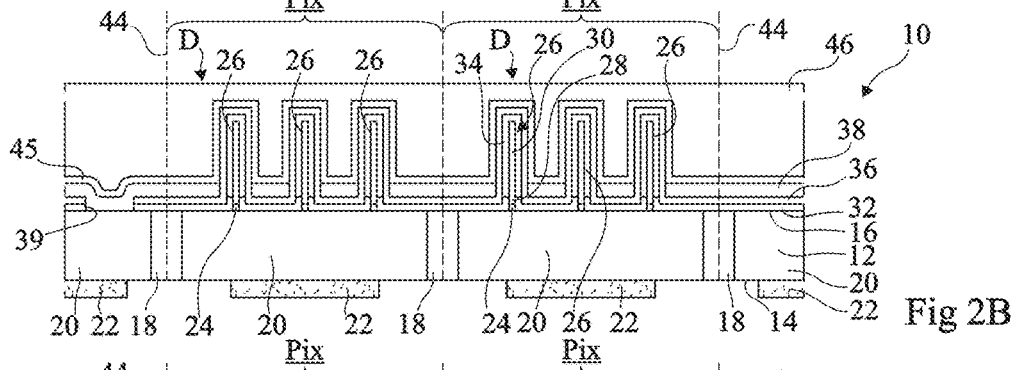
Figure 2C:
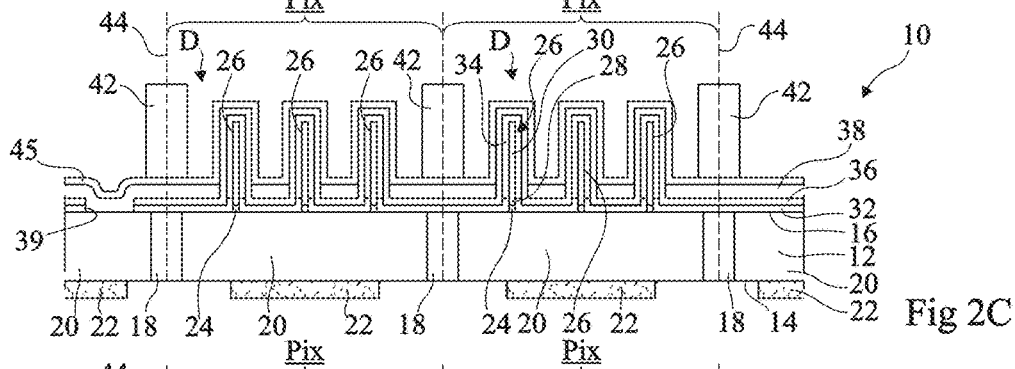

FIGS. 2A to 2C illustrate the structures obtained at successive steps of an embodiment of step (10) of the previously-described manufacturing method in the case where walls 42 are made of material partially transparent in the spectral range including the emission spectrum of the elementary light-emitting diodes and that of the luminophores, when present. The method comprises the successive steps of:

(i) Conformally depositing on the structure obtained after step (9) of the previously-described manufacturing method an electrically-insulating passivation layer 45, for example, a SiON layer (FIG. 2A).

(ii) Depositing a resin layer 46 partially transparent in the spectral range including the emission spectrum of the elementary light-emitting diodes and that of the luminophores, when present. The minimum thickness of layer 46 is equal to the height of wires 26 and the maximum thickness of layer 46 is for example approximately 60 μm.

(iii) Forming, by photolithography steps, openings in layer 46 to delimit walls 42.

Figure 3A:
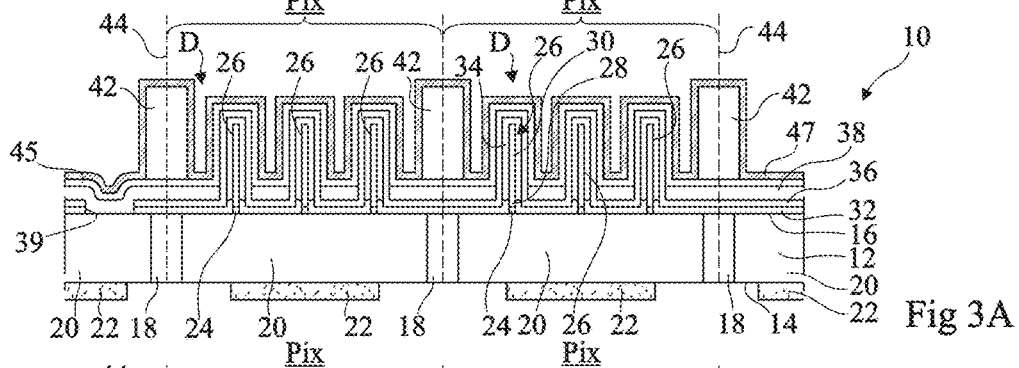
Figure 3B:
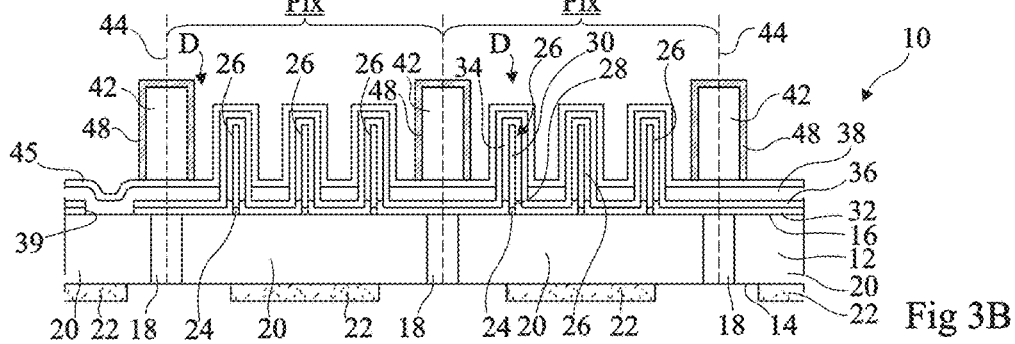

FIGS. 3A and 3B illustrate the structures obtained at successive steps of another embodiment of step (10) of the previously-described manufacturing method in the case where each wall 42 comprises a core covered with a shell made of a material opaque or reflective in the spectral range including the emission spectrum of the elementary light-emitting diodes and that of the luminophores, when present. The method comprises previously-described steps (i), (ii), and (iii) to form the core of walls 42, with the difference that the material used to form the core may be of any type, for example, a metallic or organic material. The method further comprises the successive steps of:

(iv) Conformally depositing, for example, by spray coating an opaque resin layer 47 or a reflective layer over the entire structure obtained at step (iii). The thickness of layer 47 may be in the range from 0.02 µm to 2 µm, preferably from 0.05 µm to 0.3 µm (FIG. 3A).

(v) Removing, for example, by photolithography steps, the portions of layer 47 present on the light-emitting diodes to delimit portions of opaque resin 48 at the level of walls 42 (FIG. 3B).

FIGS. 4A to 4E illustrate the structures obtained at successive steps of another embodiment of step (10) of the previously-described manufacturing method in the case where each wall 42 is metallic. The method comprises previously-described step (i) and further comprises the following successive steps:

(a) Conformal deposition of a layer 49 favoring the deposition of a metallic material. Layer 49 may comprise a stack of a titanium layer, for example having a thickness in the range from 20 nm to 400 nm, and of a copper layer, for example having a thickness in the range from 100 nm to 2 µm (FIG. 4A).

Figures 4A, 4B, 4C, 4D, 4E:
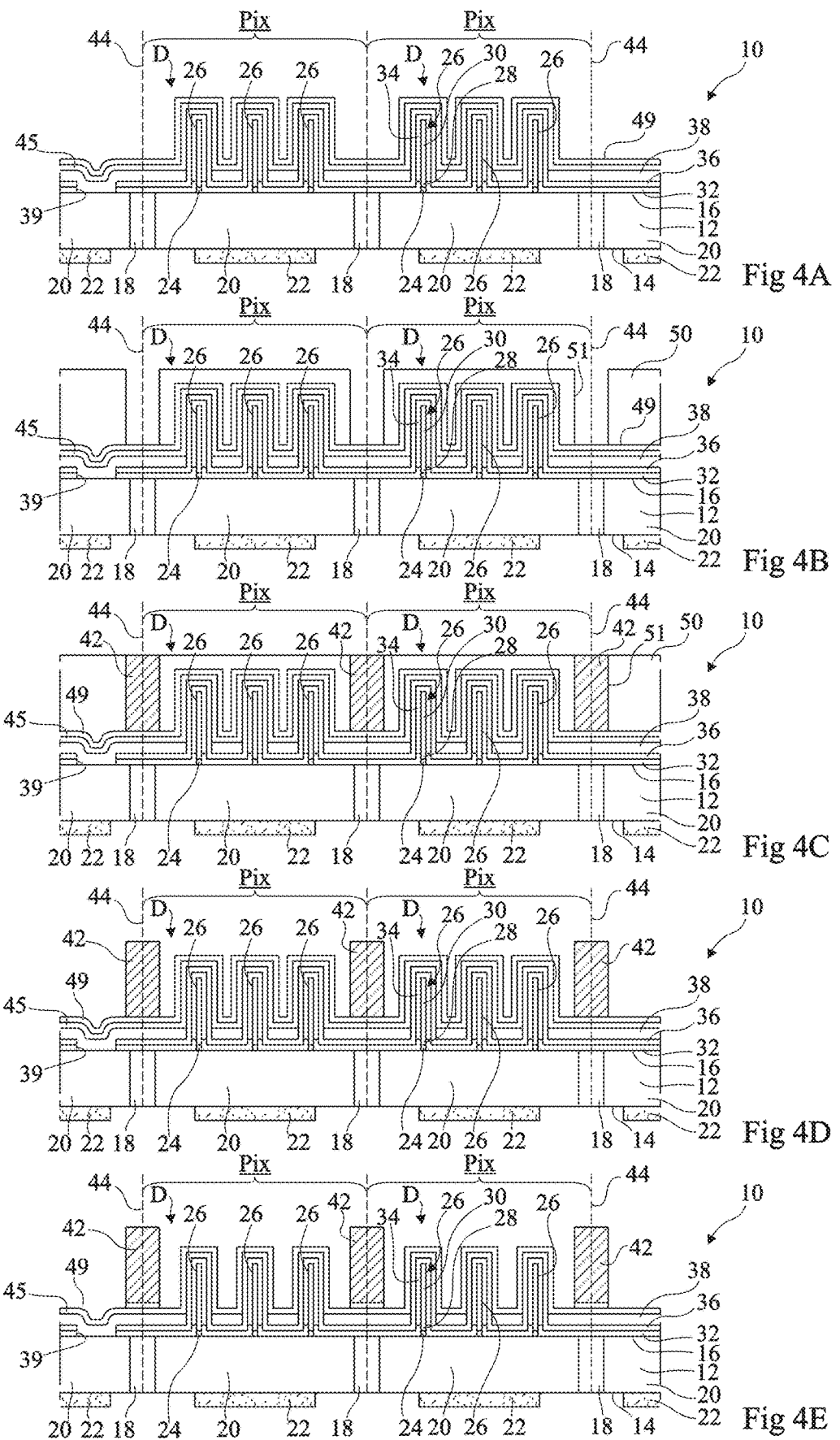

(b) Deposition of a resin layer 50 and forming, by photolithographic etching steps, of openings 51 in layer 50 at the desired locations of the walls (FIG. 4B).

(c) Deposition, for example, electrochemical deposition, of a metallic material in openings 51 of resin layer 50 to form walls 42 (FIG. 4C), the metallic material resting on layer 49.

(d) Removal of resin layer 50 (FIG. 4D).

(e) Removal of layer 49 favoring the deposition of a metallic material over the entire structure except for the portions present under walls 42 (FIG. 4E).

Figure 5A:
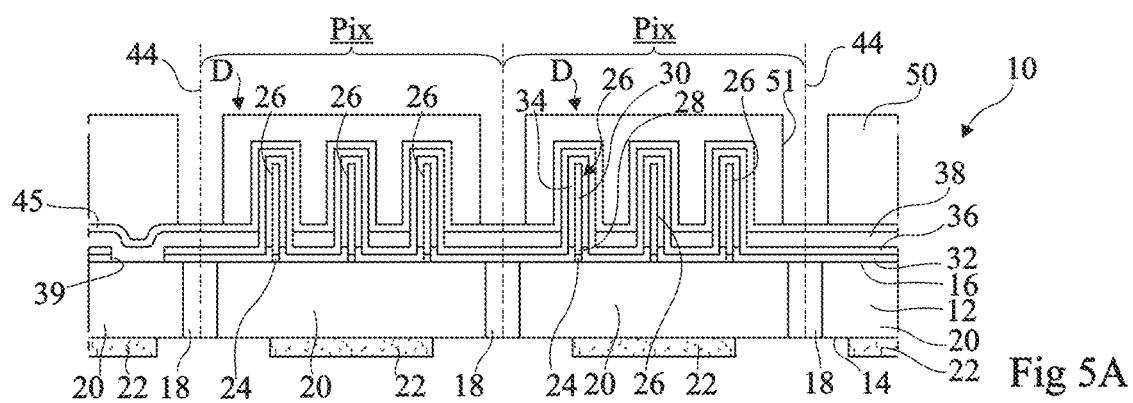

FIGS. 5A to 5D illustrate the structures obtained at successive steps of another embodiment of step (10) of the previously-described manufacturing method in the case where each wall 42 is metallic. The method comprises previously-described step (i) and further comprises the following successive steps:

(a)' Deposition of a resin layer 50 and forming, by photolithographic etching steps, of openings 51 in layer 50 at the desired locations of walls 42 (FIG. 5A).

Figure 5B:
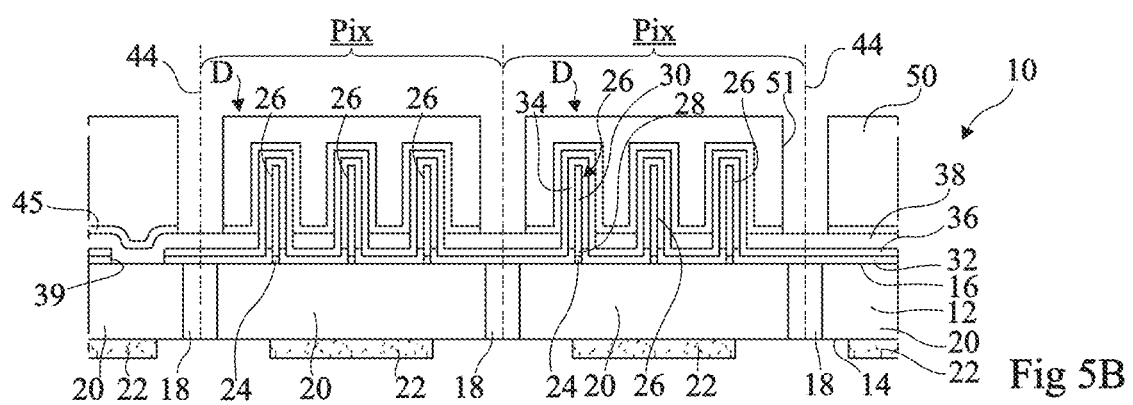
Figure 5C:
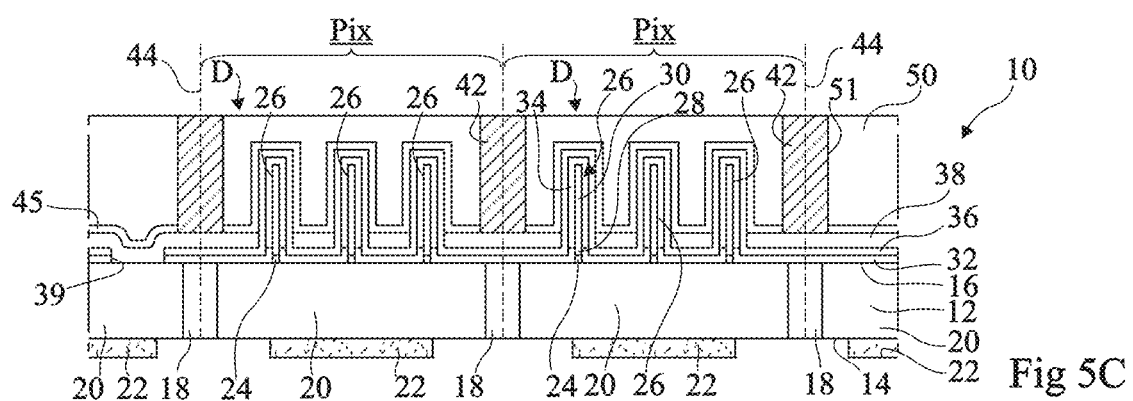

(b)' Etching of the portions of insulating layer 45 at the bottom of openings 51 (FIG. 5B).

(c)' Deposition, for example, electrochemical deposition, of a metallic material in openings 51 of resin layer 50 to form walls 42 (FIG. 5C), the metallic material being in contact with metal layer 38.

Figure 5D:
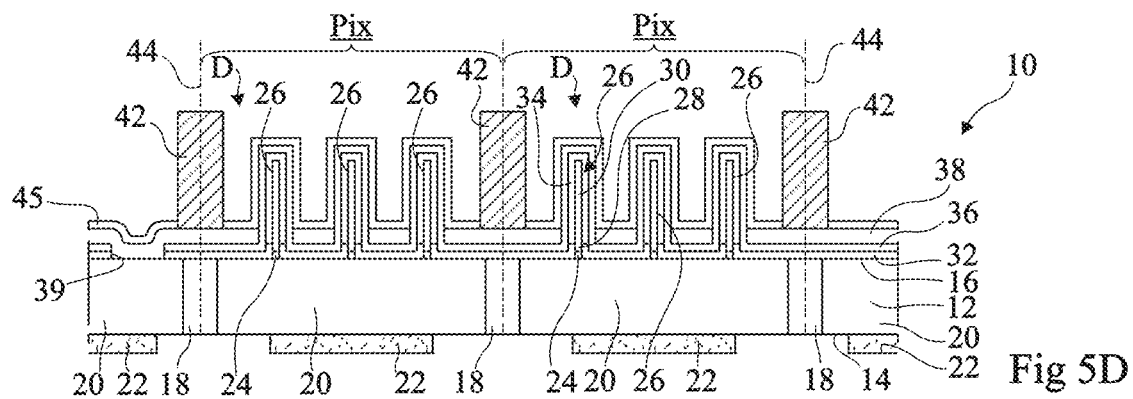

(d)' Removal of resin layer 50 (FIG. 5D).

Figure 7:
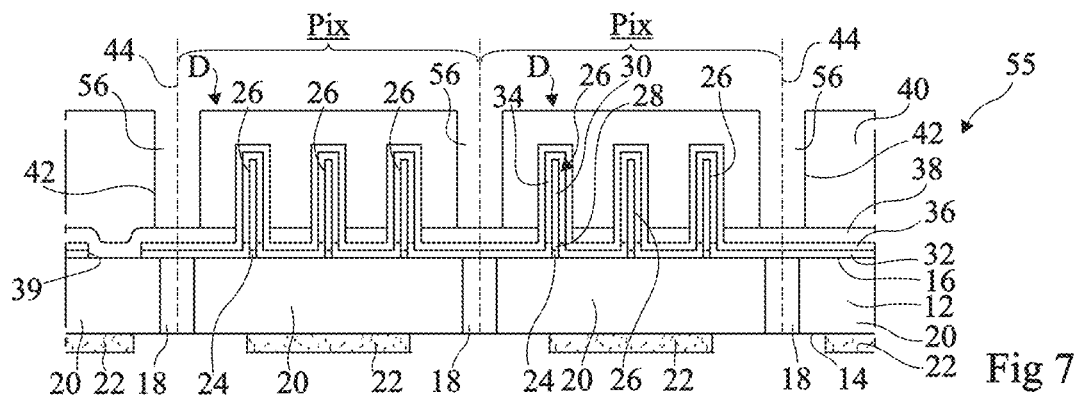

FIG. 7 shows another embodiment of an optoelectronic device 55 comprising all the elements of optoelectronic device 10, with the difference that walls 42 correspond to openings 56 filled with air provided in encapsulation layer 40. Openings 56 may have the same dimensions as those previously described for walls 42. The luminance of optoelectronic device 55, particularly along an observation direction perpendicular to upper surface 16 of substrate 12, may be greater than that of optoelectronic device 10.

Figure 8:
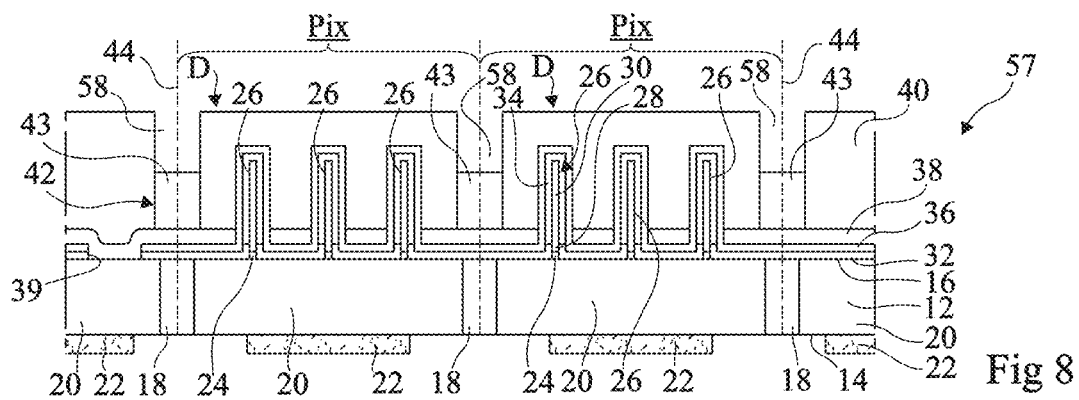

FIG. 8 shows another embodiment of an optoelectronic device 57 comprising all the elements of optoelectronic device 10, with the difference that, for at least some of walls 42, and preferably each wall 42, solid block 43 has a height smaller than the thickness of encapsulation layer 40 and is continued by an opening 58 filled with air across the rest of the thickness of encapsulation layer 40.

According to an embodiment, walls 42 have different heights. According to an embodiment, the height of the walls located between two display sub-pixels Pix associated with a same display pixel may be smaller than the height of the walls separating two display sub-pixels Pix associated with two different display pixels. According to an embodiment, the display sub-pixels corresponding to a same color may be arranged in strips and the height of the walls located between two display sub-pixels Pix associated with a same strip may be smaller than the height of the walls separating two display sub-pixels Pix associated with two different strips.

Figure 9:
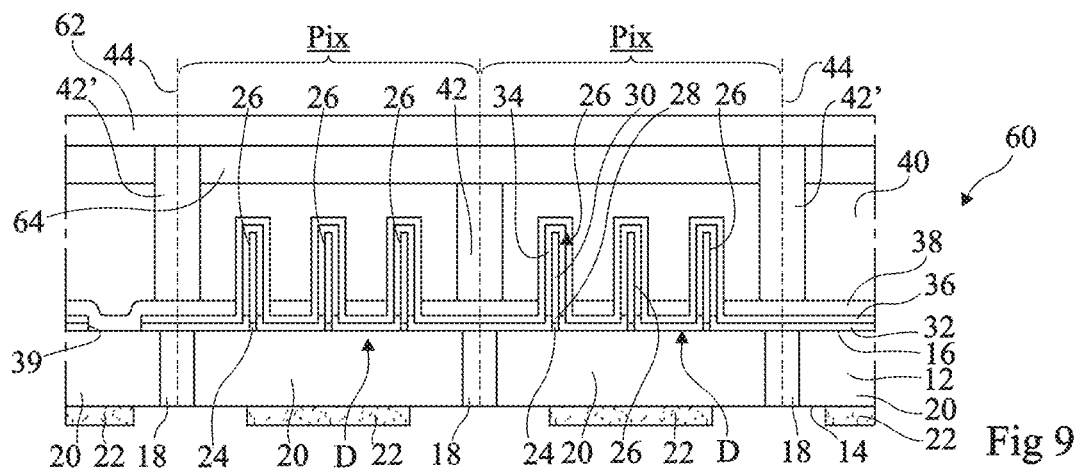

FIG. 9 shows another embodiment of an optoelectronic device 60 comprising all the elements of optoelectronic device 10, with the difference that certain walls designated with reference numeral 42', for example, the walls at the periphery of optoelectronic device 60, have a height greater than the thickness of encapsulation layer 40. Optoelectronic device 60 further comprises a plate 62 of a substantially transparent material, for example, a glass plate, resting on the ends of walls 42'. A film 64 of air or of partial vacuum, for example, at a pressure lower than 100 mbar (10,000 Pa), is present between transparent plate 62 and encapsulation layer 40. The height of walls 42' may be in the range from 10 µm to 100 µm. The width of walls 42' may be in the range from 0.5 µm to 200 µm.

An advantage of optoelectronic device 60 is that plate 62 is used as a protection cover for encapsulation layer 40. In particular, in the case where encapsulation layer 40 contains luminophores, plate 62 enables to protect the luminophores. Further, air or vacuum film 64 may correspond to a substantially tight volume, so that risks of oxidation of walls 42 which are not at the periphery of the optoelectronic device are decreased. The presence of air or vacuum film 64 enables to increase the extraction of light out of optoelectronic device 60 with respect to the case where transparent plate 62 would directly rest in contact with encapsulation layer 40. As a variation, the height of walls 42 may be greater than the thickness of encapsulation lays 40 and walls 42 may also be in contact with plate 62.

Figure 10:
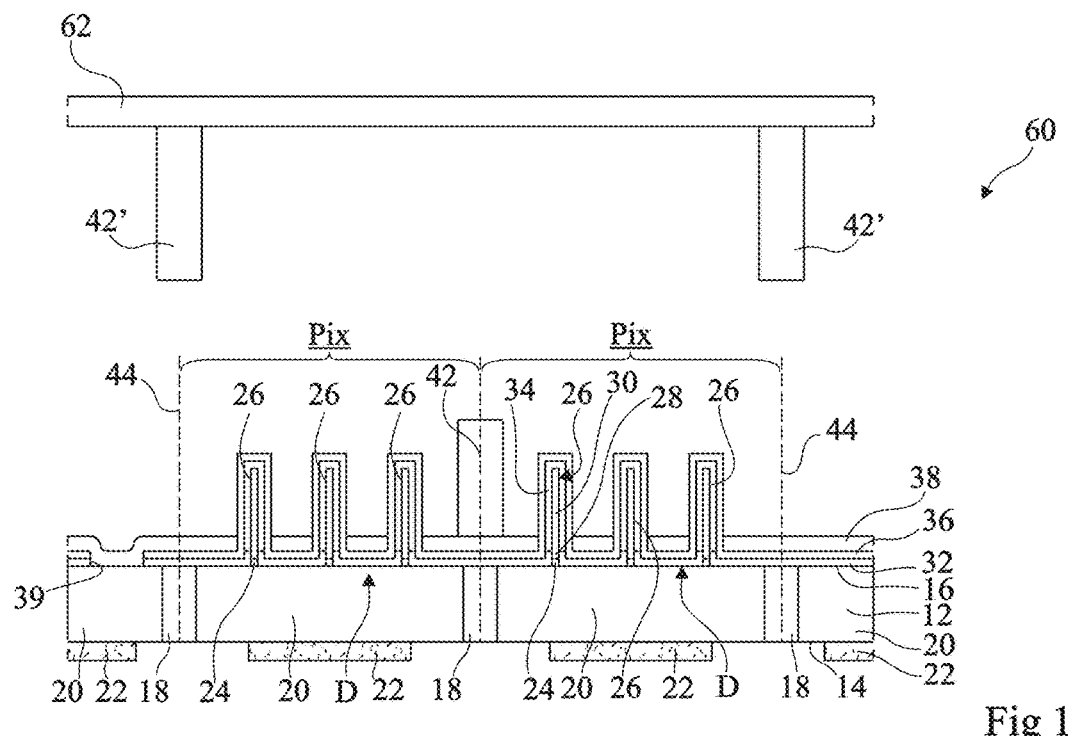

FIG. 10 illustrates a step of an embodiment of a method of manufacturing optoelectronic device 60. In this embodiment, the previously-described steps (1) to (10) may be implemented. The method comprises, independently from these steps, the forming of walls 42' on plate 62, for example, similarly to the forming of walls 42. As a variation, walls 42' may be formed by etching of a silicon layer of a substrate of SOI (Silicon On Insulator) type, where plate 62 may then correspond to the insulating layer of the SOI substrate.

Encapsulation layer 40 may be deposited on wires 26 and crosslinked and openings are formed in encapsulation layer 40 to give way to walls 42'. Walls 42' are then introduced into the openings provided in encapsulation layer 40 and affixed to metal layer 38, for example, by anodic bonding. As a variation, encapsulation layer 40 may be deposited on wires 26 and, before the crosslinking of encapsulation layer 40, walls 42' are brought closer to metal layer 38 through encapsulation layer 40. Encapsulation layer 40 is then crosslinked. According to this variation, encapsulation layer 40 may be present between each wall 42' and metal layer 38.

Figure 11:
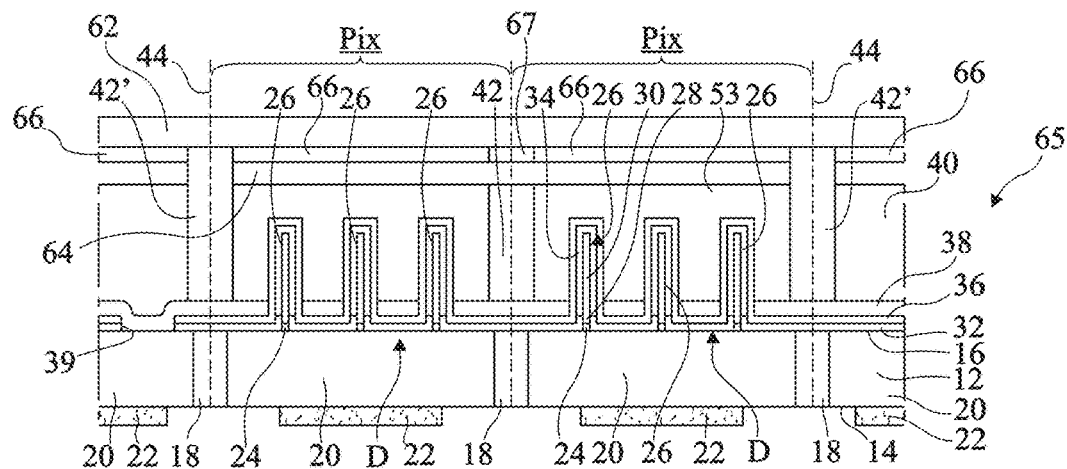

Another embodiment of optoelectronic device 60 is to manufacture walls 42' at the same time as walls 42, particularly as previously described in relation with FIGS. 4A to 4E and 5A to 5D and then to bond plate 62 to walls 42'. FIG. 11 shows another embodiment of an optoelectronic device 65 comprising all the elements of optoelectronic device 60 shown in FIG. 9 and further comprising optical filters 66 provided on plate 62. Optical filters 66 may have the same structure as the previously-described optical filters 53. Elements 67 opaque in the spectral range including the emission spectrum of the elementary light-emitting diodes and that of the luminophores, when they are present, may be provided between some of filters 66.

Figure 12:
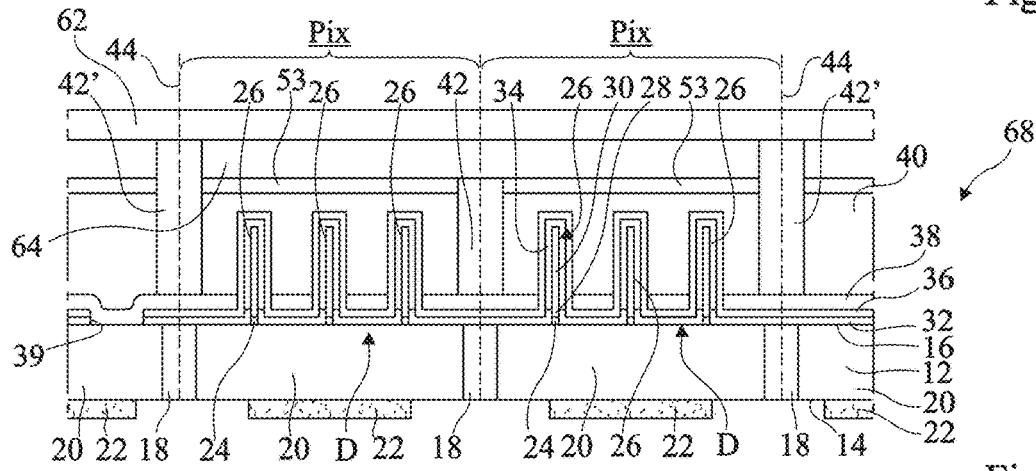

FIG. 12 shows another embodiment of an optoelectronic device 68 comprising all the elements of optoelectronic device 60 shown in FIG. 9 and further comprising, on encapsulation layer 40, the optical filters 53 previously described in relation with FIG. 6.

Figure 13:
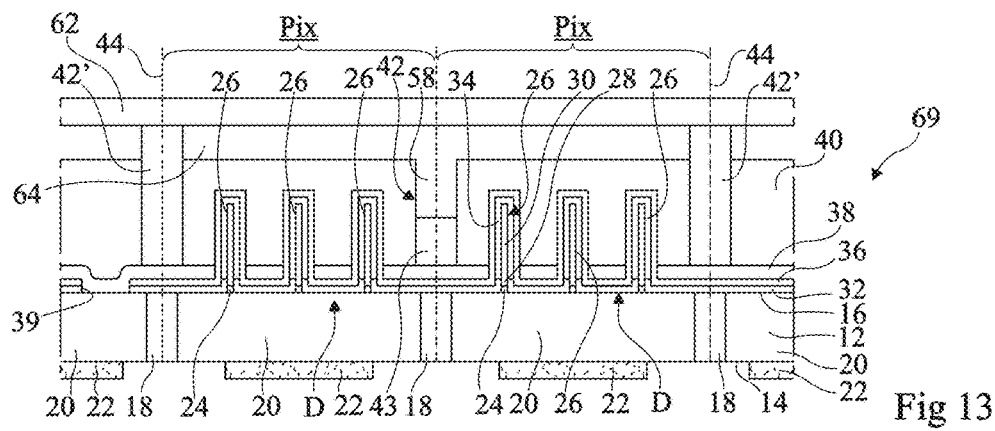

FIG. 13 shows another embodiment of an optoelectronic device 69 comprising all the elements of optoelectronic device 60 shown in FIG. 9, with the difference that at least some of walls 42 have the structure of optoelectronic device 55, that is, each comprising block 43 having a height smaller than the thickness of encapsulation layer 40 and being continued by opening 58 filled with air or with vacuum. As a variation, walls 42 may correspond to openings filled with air or with vacuum like in the optoelectronic device 55 shown in FIG. 7.

Figure 14:
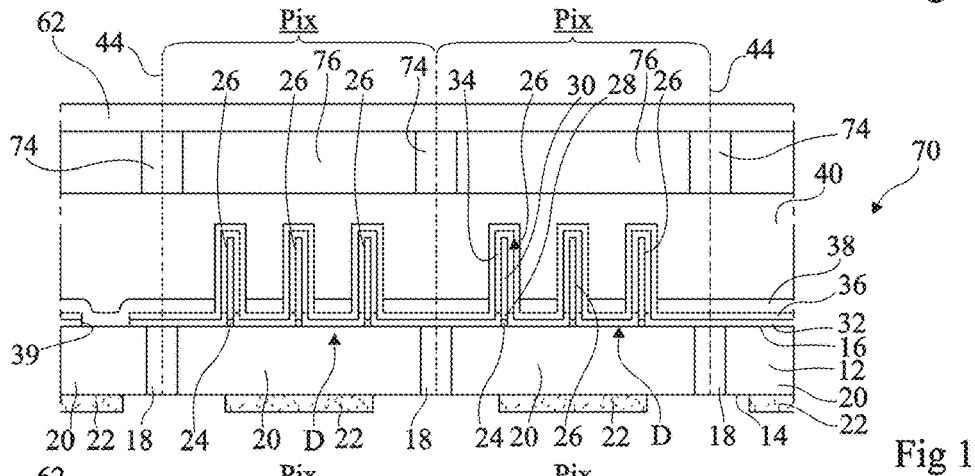

FIG. 14 shows another embodiment of an optoelectronic device 70 comprising all the elements of optoelectronic device 60 shown in FIG. 9, with the difference that walls 42 and 42' are not present and that air or vacuum film 64 is replaced with a layer 72 containing luminophores interposed between substantially transparent plate 62 and encapsulation layer 40, luminophore layer 72 being in contact with plate 62 and with encapsulation layer 40. The thickness of luminophore layer 72 may be in the range from 0.2 µm to 50 µm and preferably between 1 µm and 30 µm. Walls 74 extend in luminophore layer 72 and divide layer 72 into portions 76 containing luminophores. Walls 74 may have the same structure and the same composition as those previously described for walls 42. According to an embodiment, walls 74 or the wall sides are opaque in the spectral range including the emission spectrum of the elementary light-emitting diodes and that of the luminophores, when present. According to an embodiment, each wall 74 comprises reflective walls. Different luminophores may be provided in different portions 76.

Figure 15:
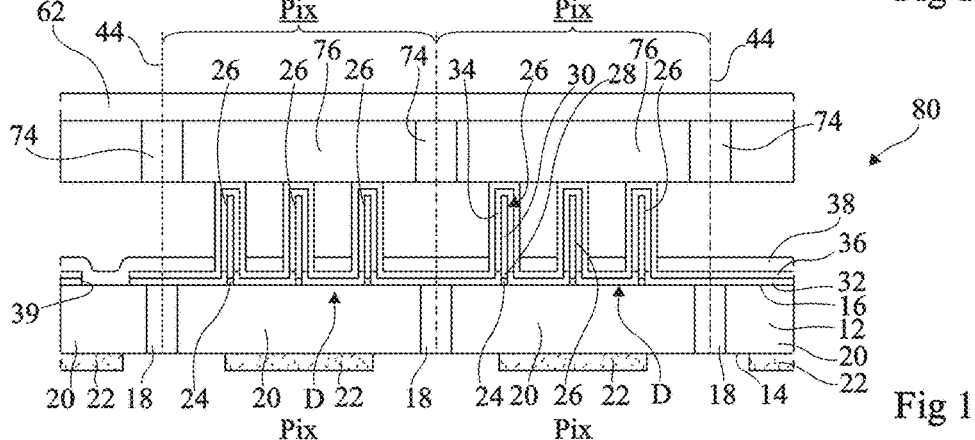

In the present embodiment, the luminophores are provided at the level of portions 76 and are not present in encapsulation layer 40. This advantageously enables to use luminophores which would be too large to be inserted between wires 26. In the present embodiment, the contrast and luminance improvement function is fulfilled by walls 74 provided in luminophore layer 72. However, the embodiments described in the present disclosure where walls are present between the assemblies of light-emitting diodes may be more favorable for the contrast improvement. FIG. 15 shows another embodiment of an optoelectronic device 80 comprising all the elements of optoelectronic device 70 shown in FIG. 14, with the difference that encapsulation layer 40 is not present and that luminophore layer 72 directly rests on the top of wires 26.

Figure 16:
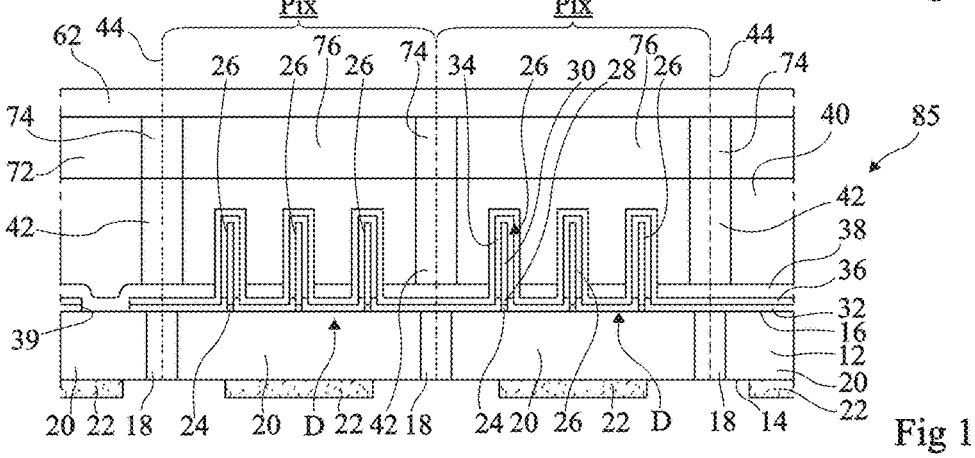

FIG. 16 shows another embodiment of an optoelectronic device 85 comprising all the elements of optoelectronic device 70 shown in FIG. 14 and further comprising walls 42 in encapsulation layer 40 like in optoelectronic device 10. In the present embodiment, the height of walls 42 is substantially equal to the thickness of encapsulation layer 40. Preferably, walls 42 are a continuation of walls 74. The presence of walls 42 and 74 provides a contrast and luminance increase with respect to optoelectronic devices 70 and 80. As a variation, walls 42 may be replaced with openings filled with air or with vacuum like in the optoelectronic device 55 previously described in relation with FIG. 7. As a variation, the height of walls 42 may be smaller than the thickness of encapsulation layer 40 and openings filled with air may be provided as a continuation of the walls, like in optoelectronic device 57 previously described in relation with FIG. 8.

According to another embodiment, walls 42 and 74 of optoelectronic device 85 are monoblock and are formed as previously described for walls 42' in relation with FIG. 10.

As a variation, optoelectronic device 70, 80, or 85 may further comprise optical filters. Each optical filter is interposed between plate 62 and one of the portions 76 containing luminophores. The optical filters may be manufactured before the forming of walls 74 and of the portions 76 containing luminophores.

Figure 17:
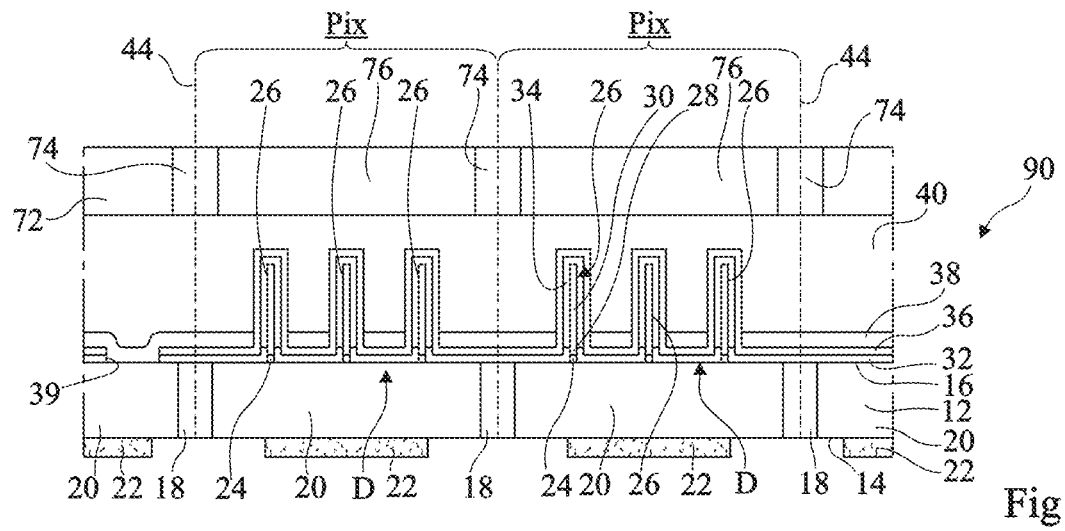

FIG. 17 shows another embodiment of an optoelectronic device 90 comprising all the components of optoelectronic device 70 shown in FIG. 14, with the difference that substantially transparent plate 62 is not present. As an example, walls 74 form part of a metal grid delimiting boxes having portions 76 containing luminophores housed therein.

Figure 18:
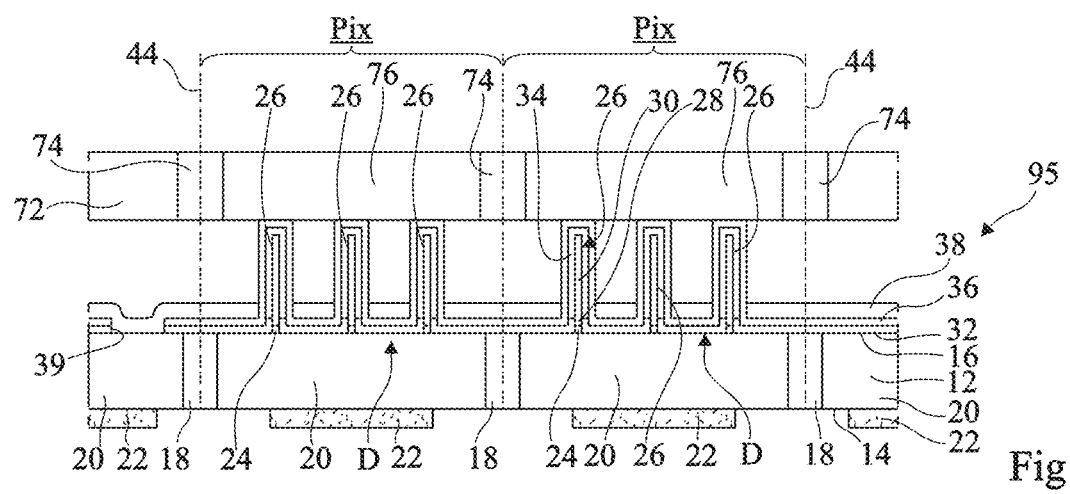

FIG. 18 shows another embodiment of an optoelectronic device 95 comprising all the elements of optoelectronic device 90 shown in FIG. 17, with the difference that encapsulation layer 40 is not present like in optoelectronic device 80 and that luminophore layer 72 directly rests on the tops of wires 26.

Figure 19:
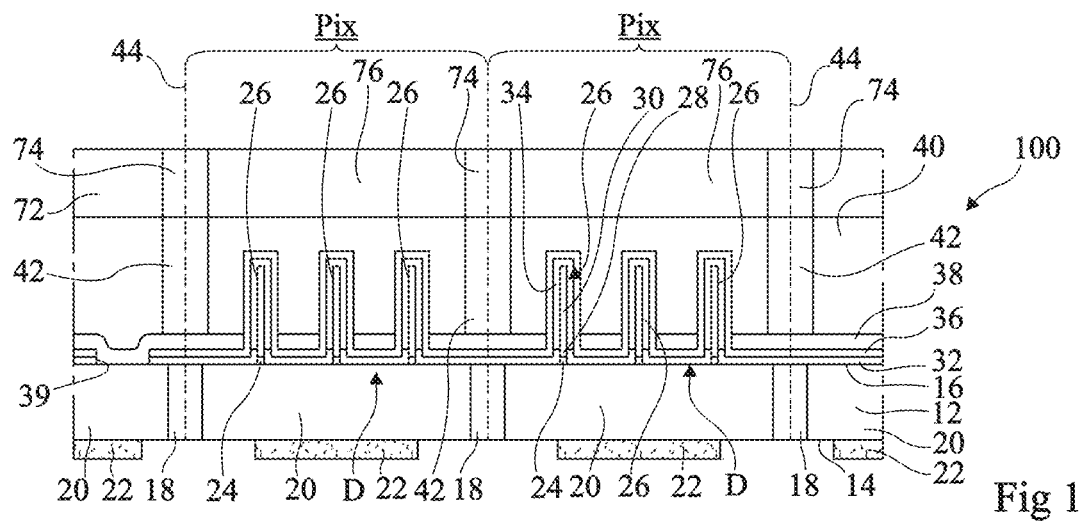

FIG. 19 shows another embodiment of an optoelectronic device 100 comprising all the elements of optoelectronic device 90 shown in FIG. 17 and further comprises walls 42 in encapsulation layer 40, like in optoelectronic device 85.

Figure 20:
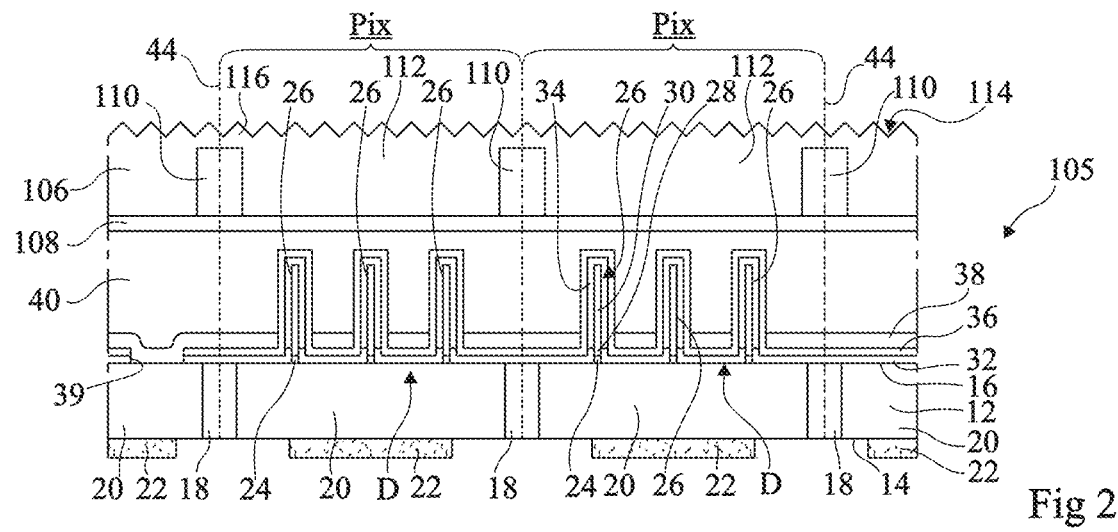

FIG. 20 shows another embodiment of an optoelectronic device 105 comprising all the elements of optoelectronic device 70 shown in FIG. 14, with the difference that plate 62 and luminophore layer 72 are replaced with a single-crystal layer 106 of a photoluminescent material affixed to encapsulation layer 40 via a layer 108 of a bonding material, for example, a silicone layer. The photoluminescent material may correspond to one of the materials previously described for optoelectronic device 10. Photoluminescent layer 106 comprises openings 110 which extend across a portion of the thickness of layer 106 but do not thoroughly cross layer 106. Openings 110 emerge on the side of encapsulation layer 40. Openings 110 are preferably located in line with walls 42 and delimit photoluminescent portions 112 in layer 106, each photoluminescent portion 112 being located opposite one of light-emitting diode assemblies D. Openings 110 may be partially or totally filled with air or with vacuum or be partially or totally filled with a material which is a good heat conductor, for example, metal or a metal alloy. Photoluminescent layer 112 may comprise a texturing on its surface 114 visible by an observer, that is, raised areas 116 which increase the extraction of light by surface 114. Openings 110 may be formed by sawing.

Figure 21:
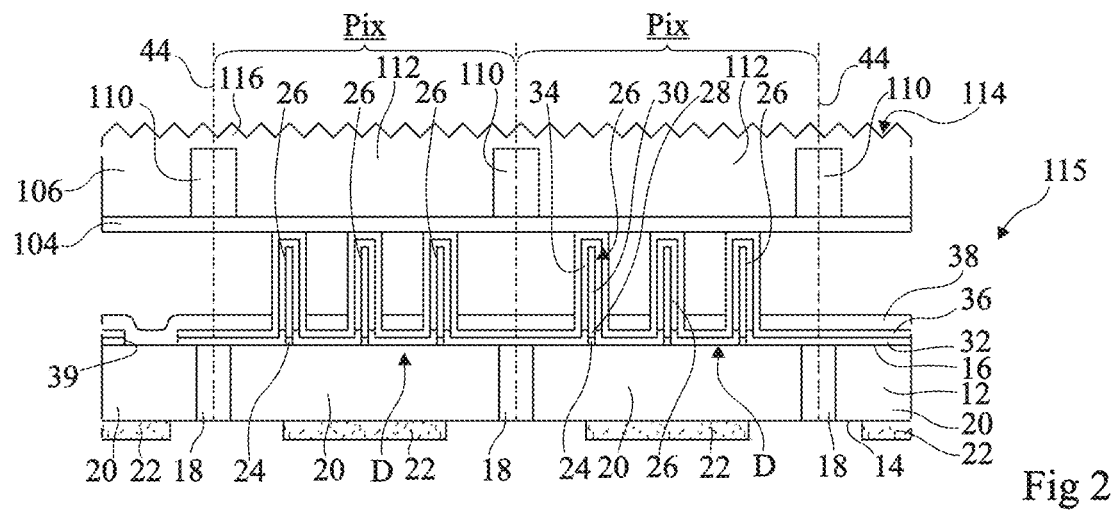

FIG. 21 shows another embodiment of an optoelectronic device 115 comprising all the elements of optoelectronic device 105 shown in FIG. 20, with the difference that encapsulation layer 40 is not present like in optoelectronic device 80 and that photoluminescent layer 112 directly rests on the tops of wires 26 via glue layer 108.

Figure 22:
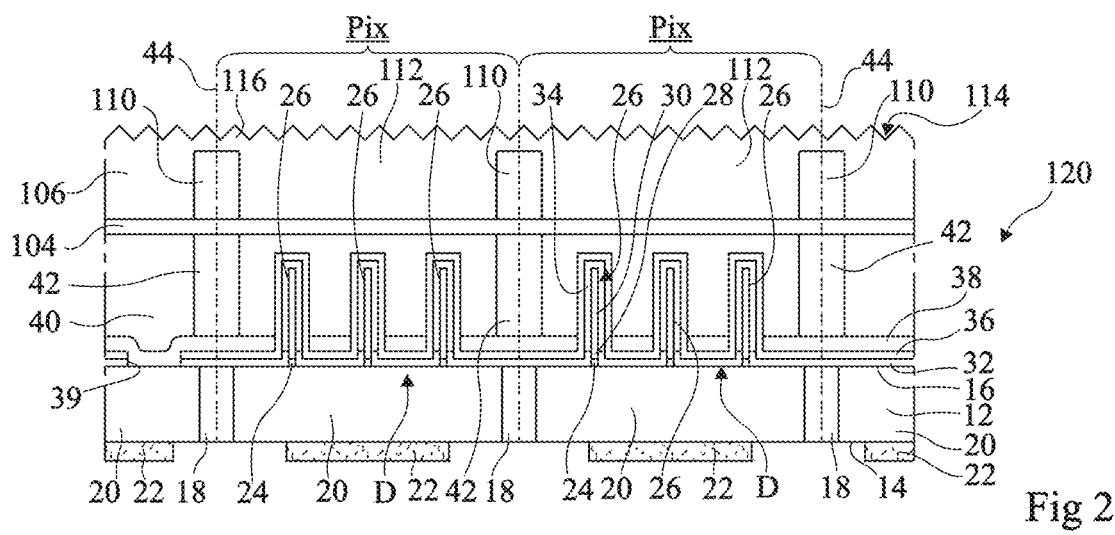

FIG. 22 shows another embodiment of an optoelectronic device 120 comprising all the elements of optoelectronic device 105 shown in FIG. 20 and further comprises walls 42 in encapsulation layer 40, like in optoelectronic device 85.

Figure 23:
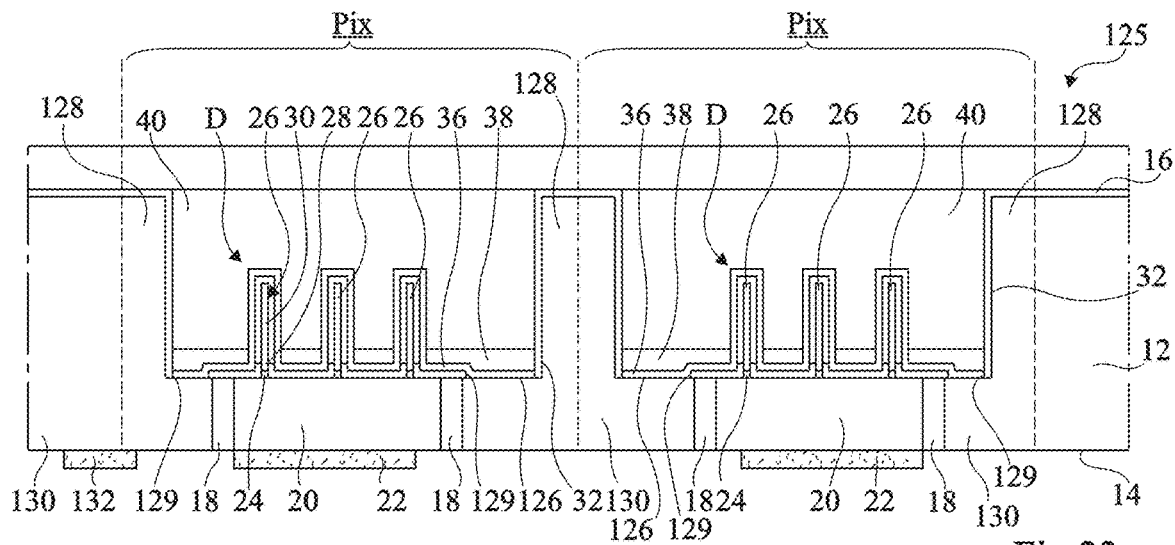

FIG. 23 shows another embodiment of an optoelectronic device 125 comprising all the elements of optoelectronic device 10 shown in FIG. 1B, with the difference that each assembly D of light-emitting diodes is formed in the bottom of a recess 126 which extends in substrate 12 from surface 16 and that walls 42 correspond to walls 128 of substrate 12 which delimit recess 126. Walls 128 particularly extend between the assemblies D of light-emitting diodes of each pair of adjacent assemblies D. Portions 128 of substrate 12 forming the walls are electrically insulated from the adjacent portions 20 of substrate 12 by electrical insulation trenches 18. The depth of each recess 126 is in the range from 2 μm to 100 μm, for example, approximately 25 μm.

Figure 24:
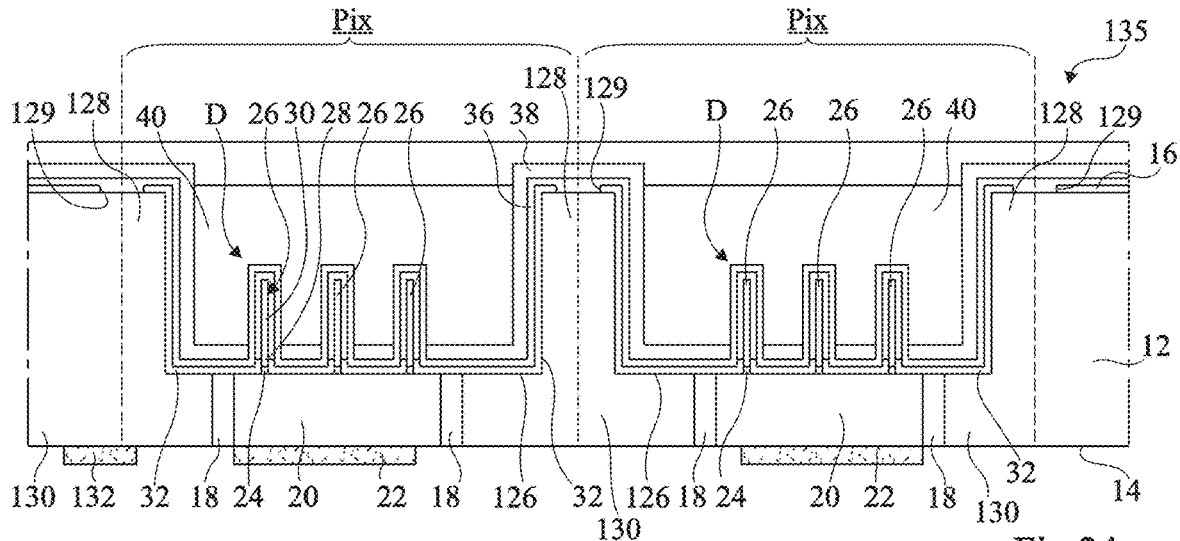

Insulating layer 32 covers the wall of each recess 126 and all of walls 128. For each assembly of light-emitting diodes D, electrode layer 36 extends on wires 26 and on the bottom of recess 126 having assembly D of light-emitting diodes formed therein and conductive layer 38 extends on electrode layer 36 between wires 26. In the present embodiment, electrode layer 36 and conductive layer 38 do not extend on walls 128. The electric connection between electrode layer 36 and/or 38 of two assemblies D of adjacent light-emitting diodes is formed via wall 128 separating the two assemblies D. To achieve this, for each display sub-pixel Pix, electrode layer 36 and/or 38 is in contact with the portion of substrate 128 via an opening 129 provided in insulating layer 32. Electrode layers 36 and/or 38 of all the assemblies D of light-emitting diodes are thus electrically coupled. In the present embodiment, trenches 18 are located in substrate 14 at the level of each recess 126 and separate portions 20 of substrate 14 from portions 130 of substrate 14 containing walls 128. Electrode layers 36 and/or 38 are electrically connected to portions 130. Further, a conductive portion 132 may be provided on surface 14 in contact with one of substrate portions 130 forming a wall electrically coupled to electric layers 36 to allow the biasing of electrode layers 36. FIG. 24 shows another embodiment of an optoelectronic device 135 comprising all the elements of optoelectronic device 120 shown in FIG. 23, with the difference that electrode layer 36 and/or 38 extends on all wires 26 and on walls 128 and is common with all light-emitting diode assemblies D. In this case, layer 32 is not opened at the bottom of recess 126 but may be opened at the top of at least some of the walls 128 delimiting recesses 126. For this purpose, electrode layer 36 and/or 38 is in contact with the top of at least some of walls 128 via openings 129 provided in insulating layer 32.

Figure 25:
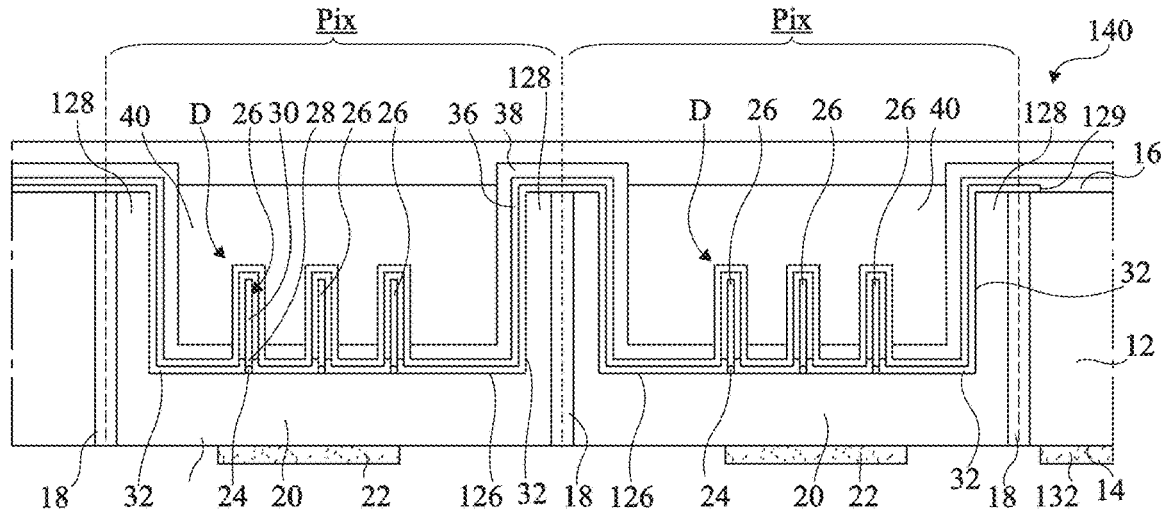

FIG. 25 shows another embodiment of an optoelectronic device 140 comprising all the elements of optoelectronic device 135 shown in FIG. 24, with the difference that trenches 18 are present in substrate 14 at the level of walls 128.

In the embodiment shown in FIGS. 23, 24, and 25, the lateral sides of walls 128 are substantially perpendicular to surfaces 14 and 16 of substrate 12. As a variation, the lateral sides of walls 128 are substantially perpendicular to surfaces 14 and 16 by an angle different from 90° and oriented to reflect the light rays emitted by the elementary light-emitting diodes and the luminophores, when present, towards the outside of optoelectronic device 125.

FIGS. 26A to 26D illustrate the structures obtained at successive steps of an embodiment of optoelectronic device 125.

Figure 26A:
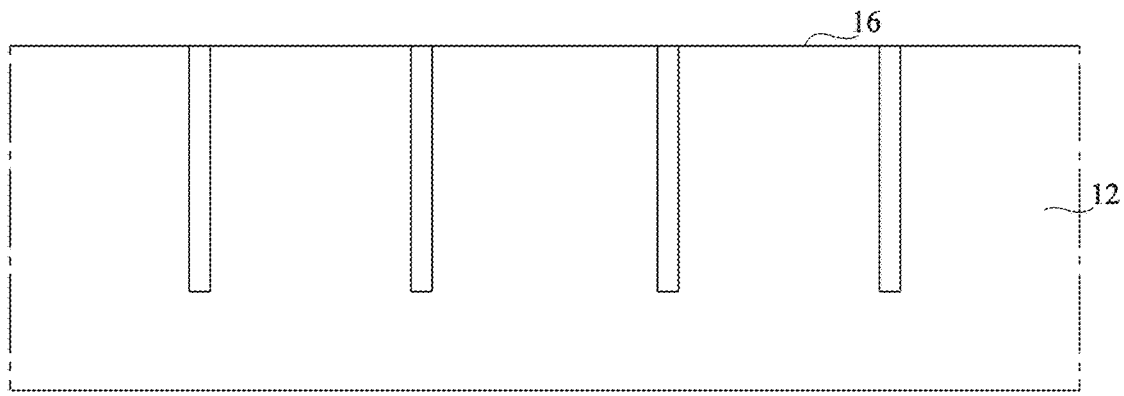
FIGS. 26A to 26D illustrate the structures obtained at successive steps of an embodiment of a method of manufacturing the optoelectronic device shown in FIG. 23.

FIG. 26A shows the structure obtained after the implementation of previously-described steps (1), (2), (3), and (4) which result in the forming, in substrate 12 which has not been thinned yet, of electrical insulation trenches 18.

Figure 26B:
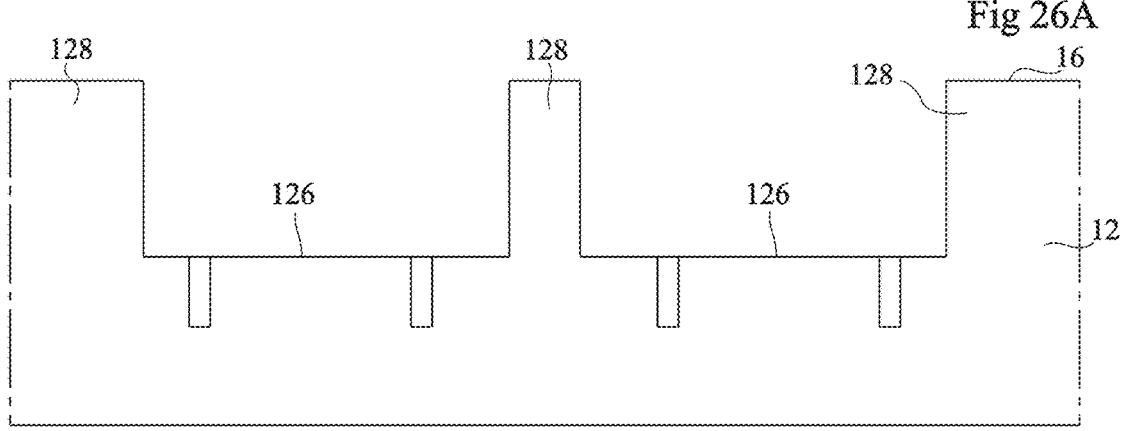

FIG. 26B shows the structure obtained after the forming of recesses 126 in surface 16 of substrate 12.

Figure 26C:
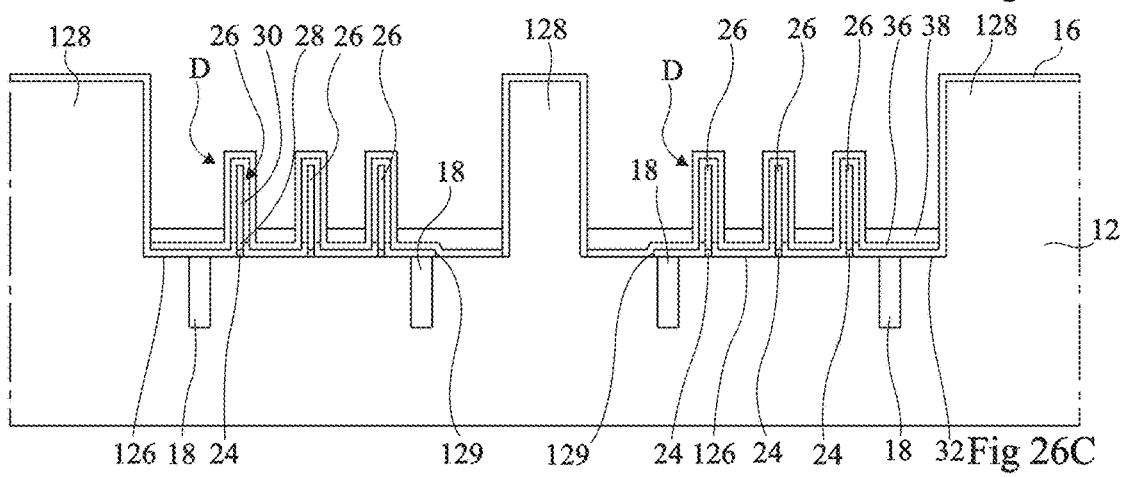

FIG. 26C shows the structure obtained after the implementation of previously-described step (5) which results in the forming, in each recess 126, of an assembly D of light-emitting diodes and in the forming of insulating layer 32 in recesses 126 and on walls 128.

Openings 129 have then been formed in insulating layer 32 and previously-described step (6) has been implemented to form electrode layer 36. According to the implemented method, electrode layer 36 may also be deposited on walls 128. A step of removing the portions of the electrode layer present on walls 128 may then be provided. Previously-described step (8) has then been implemented to form conductive layer 38 in each recess 126 between wires 26.

Figure 26D:
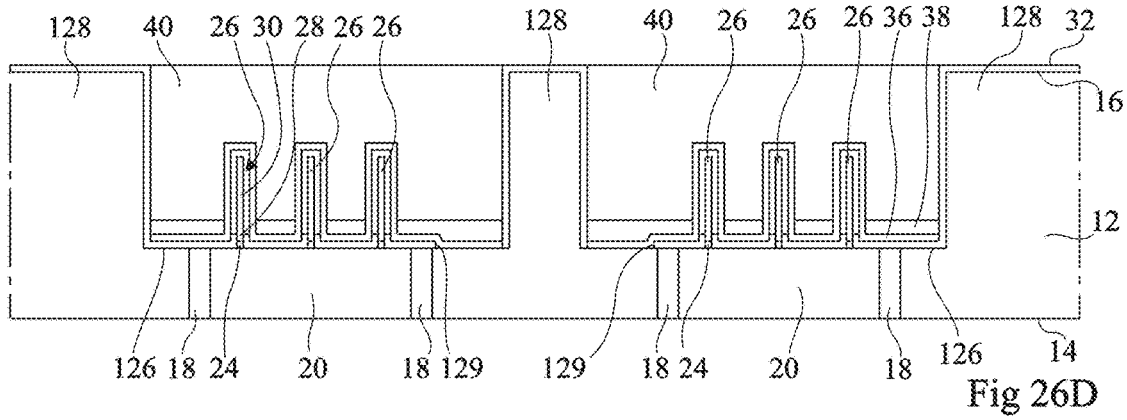

FIG. 26D shows the structure obtained after the implementation of previously described thermal anneal step (9), of previously-described step (11) of deposition of an encapsulation layer in recess 126 and on walls 128, followed by a step of etching or of planarization to obtain encapsulation layers 40 only in recess 126 and by previously-described step (12) of thinning substrate 12 to reach lateral insulating elements 18.

The method further comprises previously-described step (13) of forming conductive pads 22.

In the previously-described embodiments, optoelectronic device 10 is bonded to another circuit by fusible conductive elements, not shown, for example, solder bumps or indium bumps bonded to conductive pads 22. The assembly of optoelectronic device 10 onto another circuit, particularly on a control circuit, is performed by means of conventional matrix hybridization techniques, by means of fusible bumps, or by placing face-to-face fusible materials for example, made of indium, or of SnAg, or copper columns or gold pads (stud bump technology), or by conductive molecular bonding (copper to copper). The metal stack forming conductive pads 22 is selected to be compatible with the selected assembly technology. As an example, conductive pads 22 may be made of Cu or Ti—Ni—Au, Sn—Ag, or Ni—Pd—Au.

The active layer of shell 34 of the elementary light-emitting diodes of at least one of the assemblies of light-emitting diodes D may be manufactured differently from the active layer of the shell of the elementary light-emitting diodes of at least another assembly of light-emitting diodes. For example, the active layer of shell 34 of a first assembly may be capable of emitting light at a first wavelength, for example, blue light, and the active layer of shell 34 of a second assembly may be capable of emitting light at a second wavelength different from the first wavelength, for example, green light. This may be obtained, for example by adapting in each assembly the pitch and the size of the wires, which results in modifying the thickness and the composition of the quantum wells forming these active layers.

Further, a third assembly may be adapted to emit light at a third wavelength different from the first and second wavelengths, for example, red light. Thus, the composition of the blue, green, and red lights may be selected so that an observer perceives white light by color composition, each diode, or diode assembly, emitting at a first, second, and third wavelength capable of being addressed independently from the others to adjust the color.

In the previously-described embodiment, insulating layer 32 covers the entire contour of lower portion 28 of each wire 26. As a variation, it is possible for part of lower portion 28, or even for the entire lower portion 28, not to be covered with insulating layer 32. In this case, shell 34 may cover each wire 26 up to a height greater than the height of upper portion 30, or even along the entire height of wire 26. Further, in the previously-described embodiment, insulating layer 32 does not cover the contour of upper portion 30 of each wire 26. As a variation, insulating layer 32 may cover part of upper portion 30 of each wire 26. Further, according to another variation, insulating layer 32 may, for each wire 26, partially cover the lower portion of shell 34. According to another embodiment, layer 32 may be absent, particularly in the case where seed pads 24 are replaced with a seed layer covered with a dielectric layer and the wires are formed on the seed layer in openings provided in the dielectric layer.

Optoelectronic device 10 may be placed on another integrated circuit, particularly, a control circuit, comprising electronic components, particularly transistors, used to control the light-emitting diode assemblies of optoelectronic device 10.

In operation, conductive pads 22 electrically coupled to conductive layer 38 may be coupled to a source of a first reference potential. Conductive pad 22 in contact with portion 20 of substrate 12 having the elementary light-emitting diodes of a light-emitting diode assembly D to be activated resting thereon may be coupled to a source of a second reference potential to circulate a current through the elementary light-emitting diodes of the considered assembly D. Since each conductive pad 22 can extend over a significant part of the associated portion 20, a homogeneous distribution of the current can be obtained.

In FIGS. 1A to 1C, conductive layer 38 is shown in contact with portions 20 along a side of optoelectronic device 10. As a variation, conductive layer 38 may be in contact with portion 20 along the entire contour of optoelectronic device 10.

In the embodiments shown in FIGS. 1A to 1C, optoelectronic device 10 is electrically coupled to an external circuit via fusible materials provided on the side of lower surface 14 of substrate 12. However, other electric connection modes may be envisaged.

In the previously-described embodiments, substrate 12 is a substrate made of a semiconductor or conductive material. According to another embodiment, substrate 12 is totally or partly made of an insulating material, for example, of silicon dioxide ($SiO_2$) or of sapphire. The electric connection between conductive pads 22 and conductive layer 38 or seed pads 24 may be formed by using conductive elements crossing substrate 12 across its entire thickness, for example, through silicon vias or TSVs.

According to another embodiment, at least one conductive pad is provided in contact with conductive layer 38 on the side of front surface 16. Encapsulation layer 40 then comprises an opening which exposes the conductive pad. Neither conductive layer 38 nor electrode layer 36 are in electric contact with semiconductor substrate 12. The conductive pad is electrically coupled to an external circuit, not shown, by a wire, not shown. A plurality of conductive pads may be distributed on conductive layer 38, for example, at the periphery of the optoelectronic device.

Various embodiments with different variations have been described hereabove. It should be noted that those skilled in the art may combine these various embodiments and variations without showing any inventive step. As an example, the structure of optoelectronic device 120 shown in FIG. 22 may be implemented with the structure of optoelectronic device 55 shown in FIG. 7 or the structure of optoelectronic device 57 shown in FIG. 8.

The invention claimed is:

1. An optoelectronic device comprising:
   a substrate comprising first and second opposite surfaces,
   lateral electrical insulation elements extending from the first surface to the second surface and delimiting in the substrate first semiconductor or conductive portions electrically insulated from one another, the optoelectronic device further comprising,
   for each first semiconductor or conductive portion, an assembly of light-emitting diodes resting on the first surface and electrically coupled to the first semiconductor or conductive portion, the optoelectronic device further comprising
   a conductive electrode layer continuous between the assemblies of light-emitting diodes over the first semiconductor or conductive portions, at least partially transparent at least in an emission wavelength range of the light-emitting diodes, and covering all the light-emitting diodes,
   a protection layer containing a first dielectric material at least partially transparent at least in the emission wavelength range of the light-emitting diodes, and
   walls at least partly extending in the protection layer and delimiting in the protection layer second portions surrounding or opposite the assemblies of light-emitting diodes, the walls containing at least one second material different from the first dielectric material and the at least one second material comprising one of air, a metal, a semiconductor material, a metal alloy, and a material partially transparent at least in the emission wavelength range of the light-emitting diodes, and
   the walls further containing a core made of a material at least partially transparent at least in the emission wavelength range of the light-emitting diodes covered with a layer which is opaque or reflective at least in the emission wavelength range of the light-emitting diodes.

2. The optoelectronic device of claim 1, wherein each light-emitting diode comprises at least one wire-shaped, conical, or tapered semiconductor element integrating or covered at a top and/or at least on a portion of lateral surfaces of the semiconductor element with a shell comprising at least one active layer capable of supplying most of an emission emitted by a corresponding light-emitting diode.

3. The optoelectronic device of claim 1, wherein the protection layer surrounds each light-emitting diode.

4. The optoelectronic device of claim 1, wherein the protection layer does not surround the light-emitting diodes.

5. The optoelectronic device of claim 1, wherein the walls extend at least across an entire thickness of the protection layer.

6. The optoelectronic device of claim 1, wherein at least one of the walls comprises a solid block continued by an opening filled with air.

7. The optoelectronic device of claim 1, wherein the protection layer comprises luminophores.

8. The optoelectronic device of claim 7, wherein the luminophores comprise quantum dots.

9. The optoelectronic device of claim 1, wherein the protection layer comprises a single crystal of a luminophore.

10. The optoelectronic device of claim 1, further comprising a plate of a material at least partly transparent at least in the emission wavelength range of the light-emitting diodes and of luminophores, covering the protection layer and mechanically coupled to the substrate.

11. The optoelectronic device of claim 10, wherein the plate is separated from the protection layer by an air or partial vacuum film.

12. The optoelectronic device of claim 10, further comprising additional walls having a height greater than a thickness of the protection layer in contact with the plate and resting on the substrate.

13. The optoelectronic device of claim 10, further comprising, on the plate, filters capable of at least partly absorbing and/or of reflecting an emission emitted by the light-emitting diodes.

14. The optoelectronic device of claim 1, further comprising a conductive layer covering the electrode layer around the light-emitting diodes of each assembly.

15. The optoelectronic device of claim 1, wherein the substrate is made of silicon, of germanium, of silicon carbide, of a III-V compound, or of ZnO.

16. The optoelectronic device of claim 1, wherein each light-emitting diode comprises a wire that is mostly made of a III-V compound or of a II-VI compound.

17. The optoelectronic device of claim 1, wherein the optoelectronic device is a display screen or a projection device.

18. The optoelectronic device of claim 1, further comprising, on the protection layer, filters capable of at least partly absorbing and/or of reflecting an emission emitted by the light-emitting diodes.

19. The optoelectronic device of claim 1, wherein the walls correspond to portions of the substrate.

20. The optoelectronic device of claim 1, comprising phosphors in the protection layer.

* * * * *